United States Patent
Park et al.

(10) Patent No.: US 11,682,734 B2
(45) Date of Patent: Jun. 20, 2023

(54) RADIATION HARDENED THIN-FILM TRANSISTORS

(71) Applicant: Auburn University, Auburn, AL (US)

(72) Inventors: Minseo Park, Waverly, AL (US); Michael C. Hamilton, Auburn, AL (US); Shiqiang Wang, Draper, UT (US); Kosala Yapa Bandara, Hillsboro, OR (US)

(73) Assignee: Auburn University, Auburn, AL (US)

( * ) Notice: Subject to any disclaimer, the term of this patent is extended or adjusted under 35 U.S.C. 154(b) by 178 days.

(21) Appl. No.: 17/347,155

(22) Filed: Jun. 14, 2021

(65) Prior Publication Data

US 2021/0343868 A1 Nov. 4, 2021

Related U.S. Application Data

(62) Division of application No. 16/457,284, filed on Jun. 28, 2019, now Pat. No. 11,069,815.

(60) Provisional application No. 62/691,987, filed on Jun. 29, 2018.

(51) Int. Cl.
| | |
|---|---|
| *H01L 29/786* | (2006.01) |
| *H01L 21/768* | (2006.01) |
| *H01L 21/42* | (2006.01) |
| *H01L 21/477* | (2006.01) |

(52) U.S. Cl.
CPC .......... *H01L 29/7869* (2013.01); *H01L 21/42* (2013.01); *H01L 21/477* (2013.01); *H01L 21/76868* (2013.01)

(58) Field of Classification Search
CPC .......... H01L 29/7869; H01L 21/76868; H01L 21/42; H01L 21/477; H01L 21/02595; H01L 21/02381; H01L 21/02488; H01L 21/02554; H01L 21/02565; H01L 21/02667; H01L 29/22; H01L 29/66969
USPC ........................................... 257/43
See application file for complete search history.

*Primary Examiner* — Caleen O Sullivan
(74) *Attorney, Agent, or Firm* — Stephen H. Hall; Ryan J. Letson; Bradley Arant Boult Cummings LLP

(57) ABSTRACT

A thin-film transistor comprises an annealed layer comprising crystalline zinc oxide. A passivation layer is adjacent to the thin-film transistor. The passivation layer has a thickness and material composition such that when a dose of radiation from a radiation source irradiates the thin-film transistor, a portion of the dose that includes an approximate maximum concentration of the dose is located within the annealed layer. The annealed layer has a thickness and threshold displacement energies after it has been annealed such that: a) a difference between a transfer characteristic value of the thin-film transistor before and after the dose is less than a first threshold; and b) a difference between a transistor output characteristic value of the thin-film before and after the dose is less than a second threshold. The thresholds are based on a desired performance of the thin-film transistor.

8 Claims, 27 Drawing Sheets

RADIATION HARDENED THIN-FILM TRANSISTORS

CROSS-REFERENCE TO RELATED APPLICATIONS

This application is a division of pending U.S. patent application Ser. No. 16/457,284 titled, "Radiation Hardened Thin-Film Transistors," filed Jun. 28, 2019 which claims the benefit of and priority to U.S. Provisional Patent Application No. 62/691,987, filed Jun. 29, 2018 and entitled "Fabrication of Radiation Hard ZnO Transistors," the entire contents of which are hereby incorporated by reference herein in their entirety.

BACKGROUND

Both man-made and natural radiation events may cause damage to electronic devices, resulting in system failure. For example, electronic devices that maintain reliable operation in a radiation-harsh environment, such as the Japanese Fukushima nuclear power plant disaster site, are desirable to provide computing, sensing and control capabilities that play an indispensable role in saving invaluable human lives and valuable property. In another example, the Van Allen radiation belts located near the Earth's orbit contain high energy protons and electrons. The inner belt located in the lower Earth's orbit is suspected to contain protons with energy ranging between 0.1 and 400 mega-electron-volts ("MeV"). This radiation will crucially damage conventional electronic equipment.

Radiation-hard electronics is a burgeoning field in science and technology, and can ease the shielding burden for future space exploration missions and enable the further expansion of the horizon of human exploration endeavors. These electronics find a myriad of applications in electronic systems that will be used in space exploration, terrestrial aviation, high-energy particle accelerators, nuclear security and nuclear power generation. However, radiation shielding is large, heavy and expensive to carry on missions.

A marriage between advanced nanotechnology and solid-state electronics may give birth to a new generation of radiation-hard electronics in the near future that are practical to produce and use in radiation-harsh environments. Therefore, it is important to understand the effects of radiation (e.g., proton irradiation) on the semiconductor materials and devices for applications in which radiation-tolerance is critical. Improved techniques for producing electronic and optoelectronic devices and systems that operate properly and reliably in radiation-harsh environments are generally desired.

DETAILED DESCRIPTION

A. Definitions

Figure 1:
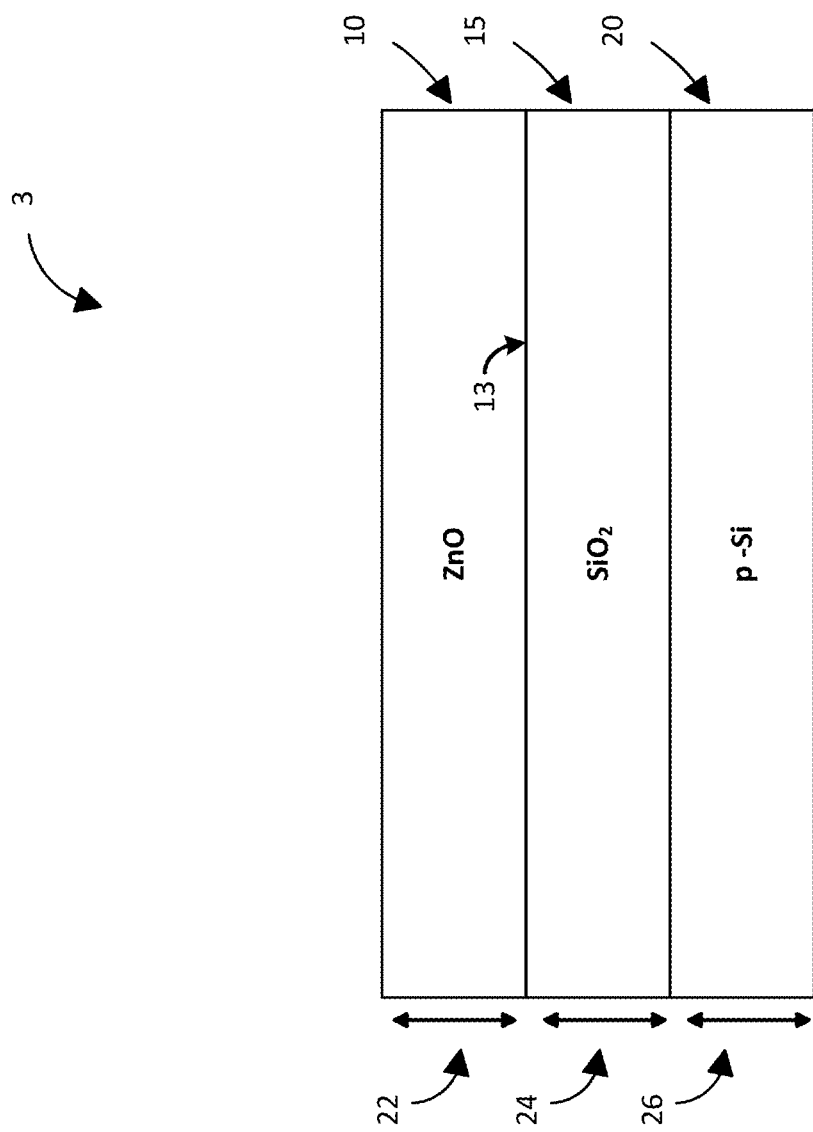
FIG. 1 shows a side view of exemplary thin-film layers in accordance with some embodiments of the present disclosure.

Unless otherwise defined, all terms (including technical and scientific terms) used herein have the same meaning as commonly understood by one of ordinary skill in the art of this disclosure. It will be further understood that terms, such as those defined in commonly used dictionaries, should be interpreted as having a meaning that is consistent with their meaning in the context of the specification and should not be interpreted in an idealized or overly formal sense unless expressly so defined herein. Well known functions or constructions may not be described in detail for brevity or clarity.

The terms "about" and "approximately" shall generally mean an acceptable degree of error or variation for the quantity measured given the nature or precision of the measurements. Typical, exemplary degrees of error or variation are within 20 percent (%), preferably within 10%, and more preferably within 5% of a given value or range of values. Numerical quantities given in this description are approximate unless stated otherwise, meaning that the term "about" or "approximately" can be inferred when not expressly stated.

It will be understood that when a feature or element is referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments.

The terminology used herein is for the purpose of describing particular embodiments only and is not intended to be limiting. As used herein, the singular forms "a", "an" and "the" are intended to include the plural forms as well, unless the context clearly indicates otherwise.

Spatially relative terms, such as "under", "below", "lower", "over", "upper" and the like, may be used herein for ease of description to describe one element or feature's relationship to another when the apparatus is right side up.

The terms "first", "second", and the like are used herein to describe various features or elements, but these features or elements should not be limited by these terms. These terms are only used to distinguish one feature or element from another feature or element. Thus, a first feature or element discussed below could be termed a second feature or element, and similarly, a second feature or element discussed below could be termed a first feature or element without departing from the teachings of the present disclosure.

Terms such as "at least one of A and B" should be understood to mean "only A, only B, or both A and B." The same construction should be applied to longer list (e.g., "at least one of A, B, and C").

The term "consisting essentially of" means that, in addition to the recited elements, what is claimed may also contain other elements (steps, structures, ingredients, components, etc.) that do not adversely affect the operability of what is claimed for its intended purpose as stated in this disclosure. Importantly, this term excludes such other elements that adversely affect the operability of what is claimed for its intended purpose as stated in this disclosure, even if such other elements might enhance the operability of what is claimed for some other purpose.

In some places reference is made to standard methods, such as but not limited to methods of measurement. It is to be understood that such standards are revised from time to time, and unless explicitly stated otherwise reference to such standard in this disclosure must be interpreted to refer to the most recent published standard as of the time of filing.

It is to be understood that any given elements of the disclosed embodiments of the invention may be embodied in a single structure, a single step, a single substance, or the like. Similarly, a given element of the disclosed embodiment may be embodied in multiple structures, steps, substances, or the like.

FIGS. 1 through 23B illustrate various views and embodiments of the present invention, and supporting graphs and data. Various embodiments may have one or more of the components outlined below. Component reference numbers used in the figures are also provided.

Repeat use of reference characters throughout the specification and appended drawings is intended to represent the same or analogous features or elements of the invention.

Film layer stack 3
Thin-film transistor ("TFT") device 5
Channel layer 10
Interface 13
Dielectric layer 15
Silicon wafer layer 20
Channel layer thickness 22
Dielectric layer thickness 24
Silicon wafer layer thickness 26
Heat source 30
Annealing heat 32
Channel layer surface 34
Source 36
Drain 38
Support layer 40
Support layer thickness 42
Radiation source 50
Radiation dose 52
Detector 58
Detection signal 59
Voltage Source 60
Logic circuit 69
Circular TFT array 70
Substrate 71
Circular TFT device 72
Circular TFT device 74
Circular TFT device 76
Circular TFT device 82
Circular TFT device 84
Circular TFT device 86
Electronic device 90
Mobile device 91
Flat panel display 92
Avionics system 93
TFT device 205
Multi-layer passivation layer 207
Heavy element layer 210
Photoresist layer 215
Buffer layer thickness 222
Photoresist layer thickness 224
Surface 234
Source 236
Drain 238

B. Radiation Hard Thin-Film Transistors

Radiation-hard electronics is anticipated to continue to expand from what is already a high-demand field that has a variety of applications across different technology types. Many types of technologies rely on use of components that include or rely on performance of materials that behave as semiconductors, including thin-film transistors ("TFTs"). As a result, development of electronics and optoelectronics with semiconductors having improved radiation tolerance can improve operation and reliability of the devices when exposed to a dose of radiation.

Note that, in the context of this document, the terms "radiation hard," "radiation tolerant" and variations thereof may generally be intended to refer to a device's ability to withstand effects of or damage from radiation. This can be expressed in terms of minimization of change in device performance, as described and shown in greater detail herein with regard to various graphs and data showing device performance measurements before and after irradiation. Radiation tolerance can also be expressed in terms of defect density found in a TFT device following irradiation by a dose of radiation, such as may be indicated by a change in threshold voltage ("$V_T$") of the TFT device, defect density of a channel layer of the device, or change in sub-threshold swing ("SS") of a TFT measured before and after irradiation. In some embodiments, a lower defect density of a material may lead to a higher radiation hardness. It is understood in the context of this document that references to radiation hardness or radiation tolerance generally refer to these characteristics and aspects of the materials, structures and devices described herein.

FIG. 1 shows a side view of exemplary thin-film layers in accordance with some embodiments of the present disclosure. The thin-film layers are arranged in a stack 3, which, in the embodiment of FIG. 1, includes a channel layer 10, a dielectric layer 15 and silicon wafer layer 20. The channel layer 10 is arranged on a top side of the dielectric layer 15, which is arranged on a top side of the silicon wafer layer 20. The layers 10, 15 and 20 are depicted as being arranged adjacent to one another in an arrangement similar to film layers of a bottom-gate TFT 5 (e.g., FIGS. 3-4). In other embodiments, other arrangements and quantities of layers may be possible. The layers depicted in the figures may not be drawn to scale.

In some embodiments, a microstructure of channel layer 10 may comprise one or more materials, such as zinc oxide ("ZnO"), zinc tin oxide ("ZnSnO" or "ZTO"), indium gallium zinc oxide ("In—Ga—Zn—O" or "a-IGZO" when amorphous), or indium zinc oxide ("In—Zn—O" or "a-IGZO" when amorphous). Note that ZnO is a metal-oxide semiconductor, and has been observed to be more radiation resistant than other semiconductor materials such as silicon ("Si"), cadmium sulfide ("CdS"), gallium arsenide ("GaAs"), and even gallium nitride ("GaN"). This radiation tolerance allows for its use in fabrication of devices and circuits to provide stable operating and performance characteristics, even when exposed to significant levels of radiation.

The stack 3 includes a dielectric layer 15 and silicon wafer 20 positioned adjacent to one another, which may be configured to permit fabrication of a TFT based on the stack. In the illustrated embodiment, the dielectric layer 15 is $SiO_2$ and the silicon wafer 20 comprises p-doped silicon, but it will be understood that the dielectric layer 15 and silicon wafer 20 may be other materials in other embodiments in order to achieve the functionality described herein.

In some embodiments, a microstructure and annealing temperature of the channel layer 10 may be identified that will achieve a desired radiation tolerance of the layer 10, and hence, a radiation tolerance of a TFT 5 that includes the layer 10 (e.g., an approximate minimization of change in device performance of the TFT 5 when irradiated). This identification may include selecting one or more materials that will make up the channel layer 10 as well as one or more states of the one or more materials. The identification also may include selecting a ratio of one or more materials to another one or more materials that will make up the channel layer 10 (e.g., a ratio of zinc to tin for a layer 10 comprising ZTO). In an embodiment, the desired microstructure may be an approximately optimum microstructure of the channel layer 10, and the desired radiation tolerance may be an essentially maximum radiation tolerance of the layer 10.

In some embodiments, the one or more materials of the channel layer 10 can be amorphous, crystalline, microcrystalline, or nanocrystalline in nature, as well as various combinations thereof. In some embodiments, the channel layer 10 may be in a single-crystal form, having few or essentially no grain boundaries. In an embodiment, the channel layer 10 comprises highly-crystalline ZnO, which may have wide and direct energy band gap of approximately 3.37 electron-volts ("eV") and which, as described further below, has been observed to have an increased radiation tolerance when annealed at high temperatures compared with other materials and states. A substance's may be considered "highly crystalline" if, for example, it has characteristics or features (e.g. band gap, crystal grain diameter or size, x-ray diffraction pattern, x-ray reflection peak, etc.) that are indicative of those associated with a highly-crystalline substance when measured using a detector capable of performing XRD techniques, such as a diffractometer. Exemplary features and measurements of highly crystalline ZnO are demonstrated, for example, in FIGS. 6A-6D, and can include aspects such as an average grain diameter of approximately 75 nm or larger, 100 nm or larger, or other values. A channel layer 10 having such high crystalline quality may be achieved through an annealing process, which is described further below. The channel layer 10 may be yet other materials and states in other embodiments.

In some embodiments, the channel layer 10 may have a thickness 22 that is selected to essentially maximize the radiation tolerance of the layer 10. In an aspect of some embodiments of the present disclosure, described further below, it has been observed that radiation tolerance of the ZnO channel layer 10 may be based partly on a material and state of the channel layer 10, partly on a thickness 22 of the channel layer 10 and partly on a temperature at which the layer 10 is been annealed. In some embodiments, thickness 22 may be approximately 50 nm or greater, but other thicknesses are possible. In the illustrated embodiment, the thickness 22 is approximately 70 nm, but, for example, when a sol-gel fabrication process is used for the channel layer 10, thickness 22 may be approximately 52 nm. Depending on application, thickness 22 can vary (e.g., thickness 22 may increase when a need for increased radiation tolerance is expected, or decrease when less radiation tolerance is needed).

In an aspect of the present disclosure, a thickness of a channel layer 10 may be measured by profilometry (e.g., via detector 58 configured to perform profilometry or similar techniques, such as a Tencor profilometer), although other measurement techniques are possible. In an embodiment of the present disclosure, one or more exemplary channel layers 10 may be fabricated (e.g., as part of a stack 3) having a thickness of approximately 70 nm, and one or more exemplary channel layers 10 may be fabricated having a thickness of approximately 200 nm. The devices may be post annealed in ambient atmosphere at 600° C., 700° C., 800° C., and 900° C., and the TFTs may be fabricated as described herein to study the device performances.

In addition, the channel layer 10 may have various widths and lengths based on desired characteristics. In an embodiment, width (W) and the length (L) of the channel layer 10 may be approximately 975 μm and 101 μm, respectively, providing a width to length ratio (W/L) of approximately 9.6. Other dimensions and ratios are possible in other embodiments.

Note that, in some embodiments, the channel layer 10 may be fabricated by deposition onto the dielectric layer 15, such as via sputtering, using a sol-gel process, or various other techniques or combinations thereof. In the illustrated embodiment, the ZnO channel layer 10 has been deposited by Radio-Frequency ("RF") magnetron sputtering onto a dielectric layer 15 comprising $SiO_2$. Exemplary parameters for RF magnetron sputtering are described in Table I for channel layer 10 having a thickness 22 of approximately 70 nm and a channel layer 10 having a thickness 22 of 200 nm.

TABLE I

| RF magnetron sputtering parameters. | |
|---|---|
| Sputtering power (W) | 160 |
| Sputtering time (s) | 1300 (~70 nm) and 5400 (~200 nm) |
| Ar flow rate (sccm) | 25 |
| $O_2$ flow rate (sccm) | 1 |
| Deposition pressure (mTorr) | 5 |
| Substrate holder rotation (%) | 50 |

In some embodiments, sol-gel fabrication may be used to form the layer 10. It has been observed that use of a sol-gel deposition technique offers several key advantages, namely that it has a relatively low cost, it is simple to set up, and can allow a high through-put. In some embodiments, a channel layer 10 (e.g., comprising ZnO) may be grown via the sol-gel technique, followed by fabrication of a TFT 5 as described herein. Additional information and techniques for fabricating a TFT with a sol-gel derived channel layer 10 are described in U.S. Provisional Patent Application No. 62/691,987, filed Jun. 29, 2018 and entitled "Fabrication of Radiation Hard ZnO Transistors."

In the illustrated embodiment, silicon wafer 20 has a thickness 26 and comprises a thermally oxidized, highly p-doped (e.g., with boron) Si wafer with an approximate <100> orientation and approximately 0.001-0.005 Ωcm resistance, and is suitable for ZnO deposition. The thickness 26 may be various suitable thicknesses for a silicon wafer of a bottom-gate TFT. Other characteristics are possible in other embodiments. Indeed, although the wafer 20 in the illustrated embodiment is a silicon wafer, the wafer 20 may be other materials in other embodiments. Similarly, other materials may be used for dielectric layer 15 in other embodiments. The thickness 24 of the oxide ($SiO_2$) of the dielectric layer 15 is approximately 100 nm, although other thicknesses may be possible in other embodiments.

Figure 2:
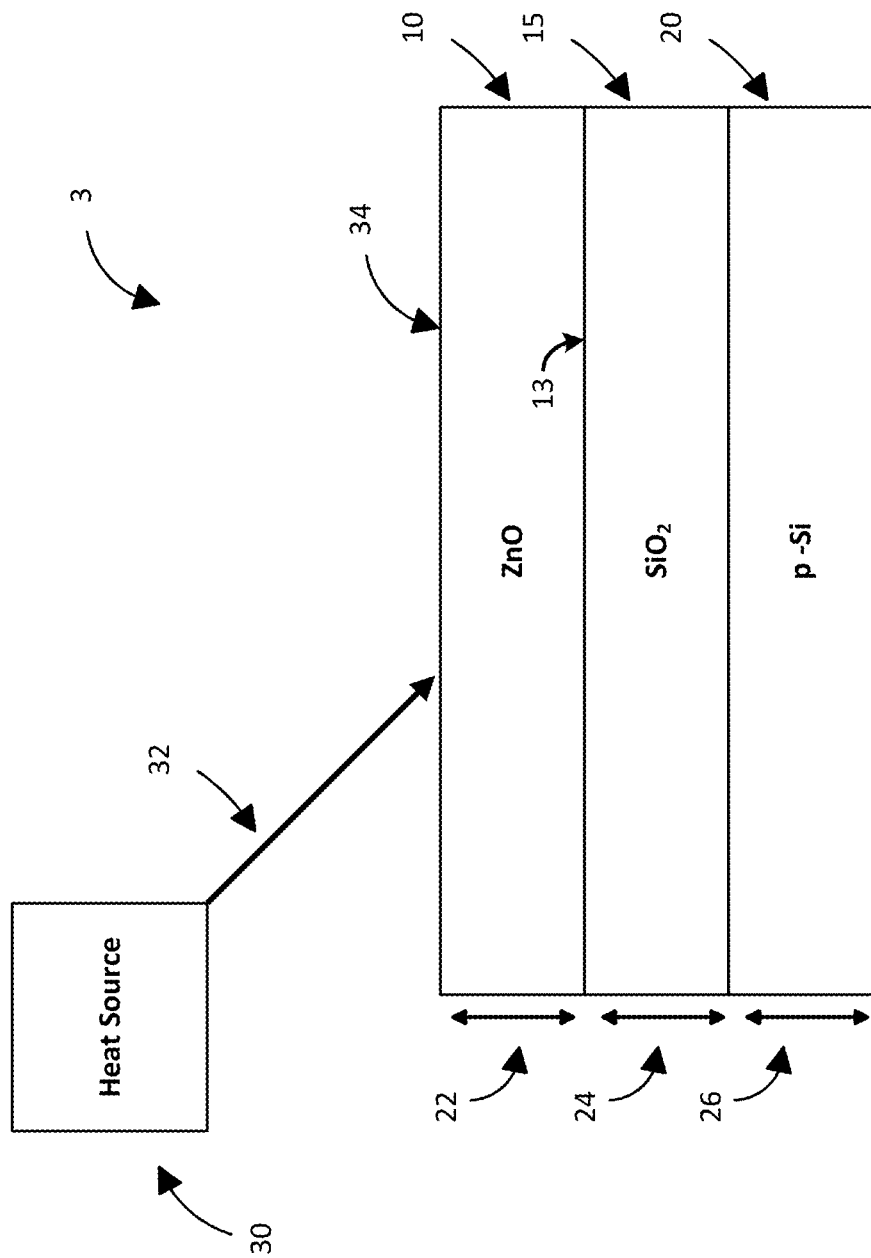
FIG. 2 shows a side view of exemplary thin-film layers and a heat source in accordance with some embodiments of the present disclosure.

FIG. 2 shows a side view of exemplary thin-film layers and a heat source in accordance with some embodiments of the present disclosure. In addition to material composition of the layer 10, it has been observed that annealing a channel layer 10 at a high temperature may improve radiation hardness of the channel layer 10.

In the illustrated embodiment, a heat source 30 is configured to emit annealing heat 32 at a temperature selected based on a desired annealing of the channel layer 10. The annealing heat 32 can be various temperatures in order to achieve a desired annealing of a material or device, as described below.

In an embodiment, an annealing temperature of the layer 10 may be identified that will approximately maximize a radiation tolerance of the layer 10. Based on a desired radiation tolerance of the layer 10 and the one or more materials selected for the channel layer 10, a temperature at which the layer 10 should be annealed may be selected that will achieve a desired annealing of the layer 10. The temperature needed to achieve the desired annealing may be selected based on various effects on the layer 10 of annealing at the respective temperature.

For example, an annealing temperature may be selected based on an improvement in crystal quality of a layer 10 comprising crystalline materials (e.g., a temperature that will achieving high or approximately maximized crystallinity of the material). The annealing temperature also may be selected based on a desired reduction or an approximate minimization of a defect density or subthreshold swing after irradiation of a layer 10 comprising non-crystalline materials (e.g., amorphous or nanocrystalline material). In some embodiments, the annealing temperature may be selected based on a desired ratio of integrated intensity of ultraviolet ("UV") to visible photoluminescence ("PL") bands of a layer 10. Further, the annealing temperature may be selected based on an approximate minimization of change in performance of a TFT comprising the layer 10. In other embodiments, the annealing temperature may be selected based on occurrence of other desired effects that increase a radiation tolerance of the layer 10 when it is annealed at the temperature. In an embodiment, annealing a channel layer 10 comprising crystalline ZnO at a temperature of at least approximately 600° C. may improve crystal quality of the layer 10 in a manner sufficient to increase its radiation hardness. Similar parameters may be used for a channel layer 10 comprising other materials.

The heat source 30 is configured to anneal the stack 3 by emitting annealing heat 32 for a period of time sufficient to achieve desired annealing, such as one hour or other time period. Although a single heat source 30 is pictured, it will be understood that one or more heat sources 30 may be used in some embodiments in order to achieve the functionality described herein. It also will be understood that, although in the illustrated embodiment, the heat source 30 is shown as a standalone device, in some embodiments, the heat source 30 may be a heating element in a box furnace or similar device (not specifically shown).

The annealing heat 32 may be various temperatures based on the characteristics of one or more materials of the channel layer 10 and desired radiation tolerance of the layer 10. As described herein, for various materials, annealing the layer 10 at a high temperature may improve its radiation tolerance. In some embodiments, the annealing heat 32 may have a temperature of approximately 600° C. or higher; approximately 650° C. or higher; approximately 700° C. or higher; approximately 750° C. or higher; approximately 800° C. or higher. The annealing temperature of the annealing heat 32 also may be in various ranges, such as between approximately 700°–850° C.; approximately 700°–750° C.; approximately 750°–800° C.; or approximately 800°–850° C. In an embodiment in which the channel layer 10 comprises ZTO, the annealing heat 32 may be approximately 500° C. or higher. Other temperatures and temperature ranges are possible in other embodiments.

During annealing, a temperature of annealing heat 32 may be varied, such as when variation of the annealing heat 32 temperature will yield a desired annealing effect (e.g., when doing so will achieve a desired annealing and radiation tolerance of one or more materials of the channel layer 10). The annealing heat 32 may have a first temperature value and may anneal the layer 10 at the first temperature value during a first time period. The annealing heat 32 may have a second temperature value (e.g., via adjustment of heat source 50) and may anneal the layer 10 at the second temperature value during a second time period. Thereafter, additional variations of a temperature of the annealing heat 32 may occur over additional time periods, and the annealing heat 32 may anneal the layer 10 at the various temperatures over the respective additional time periods.

The channel layer 10 may be placed (e.g., along with the other layers of stack 3) into the box furnace for annealing by annealing heat 32 from the source 30. The heat source 30 may be configured to increase an amount of heat in an environment where the channel layer 10 is located to raise an ambient temperature in the environment and thereby anneal the layer 10. In this regard, the annealing heat 32 from the heat source 30 may correspond to an ambient (e.g., air) temperature of the environment. Thus, the annealing heat 32 may be essentially constant over substantially an entire surface area of the channel layer 10, other layers of stack 3, or various combinations thereof. In other embodiments the heat source 30 may be configured to emit the annealing heat 32 to directly anneal a desired portion of the surface 34 of the channel layer 10 for which annealing is desired, such as when annealing of one or more portions of the surface 34 at a first temperature is desired and annealing of one or more portions at a second temperature is also desired.

In the illustrated embodiment, the annealing heat 32 is incident on surface 34 of the channel layer 10 and anneals the surface 34 of the layer 10. When the channel layer 10 (e.g., surface 34) is annealed, properties and characteristics of the layer 10 may change. For example, physical properties of the layer 10 (e.g., crystallinity and texture/roughness of surface 34, ratio of intensity of UV to visible photoluminescence bands, etc.) as well as electrical properties (e.g., transfer characteristics, output characteristics, saturation current, an on-to-off current ratio, field effect mobility, etc.) may change.

It has been observed that a change in such properties may be based on a temperature of the annealing heat 32 that is used to anneal the layer 10. As an example, for devices such as a stack 3 that comprises a crystalline ZnO channel layer 10, a crystal quality of the ZnO channel layer 10 may be increased. As described and shown further below, an amount of increase of the crystal quality of the ZnO layer 10 may be based on a temperature at which the layer 10 is annealed. Thus, higher annealing temperatures may yield larger increases in crystallinity of the channel layer 10. Crystal quality also may be assessed via a determination of crystallinity (e.g., crystal size, quantity and quality) of by performing x-ray diffraction, Raman spectroscopy, or photoluminescence of the layer 10.

In addition, it is an aspect of embodiments of this disclosure that a threshold atomic displacement energy ($E_d$) of a material is one of the metrics used to evaluate a material's radiation hardness. It has been observed that a material with higher $E_d$ may be likely to have less permanent displacement damage (DD) upon irradiation. The DD effect may be a more permanent change in device structures and may result in degradation of device performance if a level of DD exceeds a performance threshold or device failure if a level of DD exceeds a failure threshold. Materials having higher atomic displacement energy threshold may have a higher radiation tolerance, such as ZnO (e.g., approximately 18.5 eV for Zn, and approximately 41.4 eV for O) compared with GaN (19.5 eV), Si (12.9 eV), and GaAs (9.5 eV). Note also that, non-ionizing energy loss variation may reflect a displacement damage effect in a material.

Figure 23B:
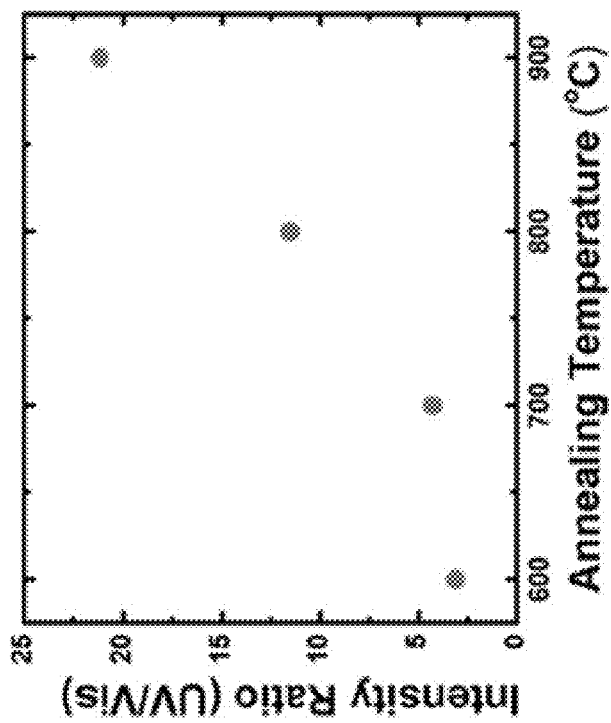
FIG. 23B is a graph depicting exemplary ratios of integrated intensity of ultraviolet to visible band of a ZnO film annealed at various temperatures in accordance with some embodiments of the present disclosure.
Figure 23A:
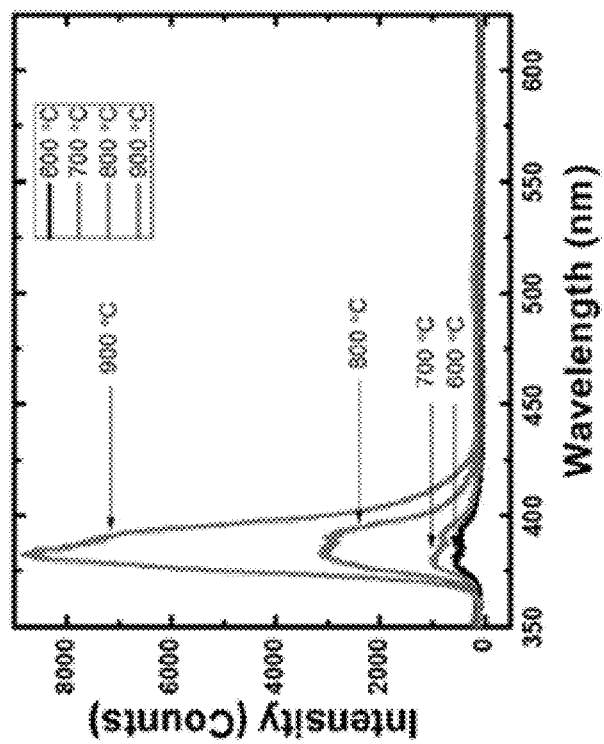
FIG. 23A is a graph depicting exemplary photoluminescence spectra of a ZnO film annealed at various temperatures in accordance with some embodiments of the present disclosure.

Briefly turning to FIGS. 23A and 23B, the figures show graphs illustrating exemplary data of photoluminescence ("PL") spectra of ZnO channel layers 10 annealed at 600° C., 700° C., 800° C., and 900° C. for approximately one hour, respectively, as well as values of integrated intensity ratios of ultraviolet ("UV") to visible bands ($I_{UV}/I_{VIS}$) for the channel layers 10. In the embodiment of the figures, the PL spectra comprise two distinct bands; UV and visible bands. As can be seen from FIG. 23A, an absolute intensity of the UV bands may increase as annealing temperature increases. It has been observed that visible bands may be related to intrinsic defects in ZnO films and the intensity of the band observed in the exemplary data of the figures may be very low. FIG. 23B shows a ratio of integrated intensity of UV to visible bands ($I_{UV}/I_{VIS}$) as a function of annealing temperature of the layer. In the exemplary data of the figures, the integrated intensity ratio increases as annealing temperature increases, which indicates that a quality of ZnO channel layer improves as a temperature at which the layer is annealed increases.

In an embodiment, an annealing temperature for the channel layer 10 may be selected based on a temperature that will achieve a desired value of a ratio of integrated intensity of ultraviolet to visible bands for the channel layer 10. In some embodiments, the integrated intensity ratio may depend on the one or more materials selected for the layer and a desired radiation tolerance for the channel layer 10. In an embodiment, the channel layer 10 may comprise a ZnO film, and exemplary ratio values indicative of suitable radiation tolerance may be approximately 5 or higher or approximately 10 or higher. Other values are possible in other embodiments.

Returning to FIG. 2, the channel layer 10 may have a thickness and threshold displacement energies after it has been annealed such that a difference between a transfer characteristic value of the TFT 5 before a dose of radiation (e.g., dose 52, FIG. 4) and the transfer characteristic value after the dose is less than a first threshold, and a difference between a difference between a transistor output characteristic value of the thin-film before the dose and the transistor output characteristic value after the dose is less than a second threshold.

Figure 11:
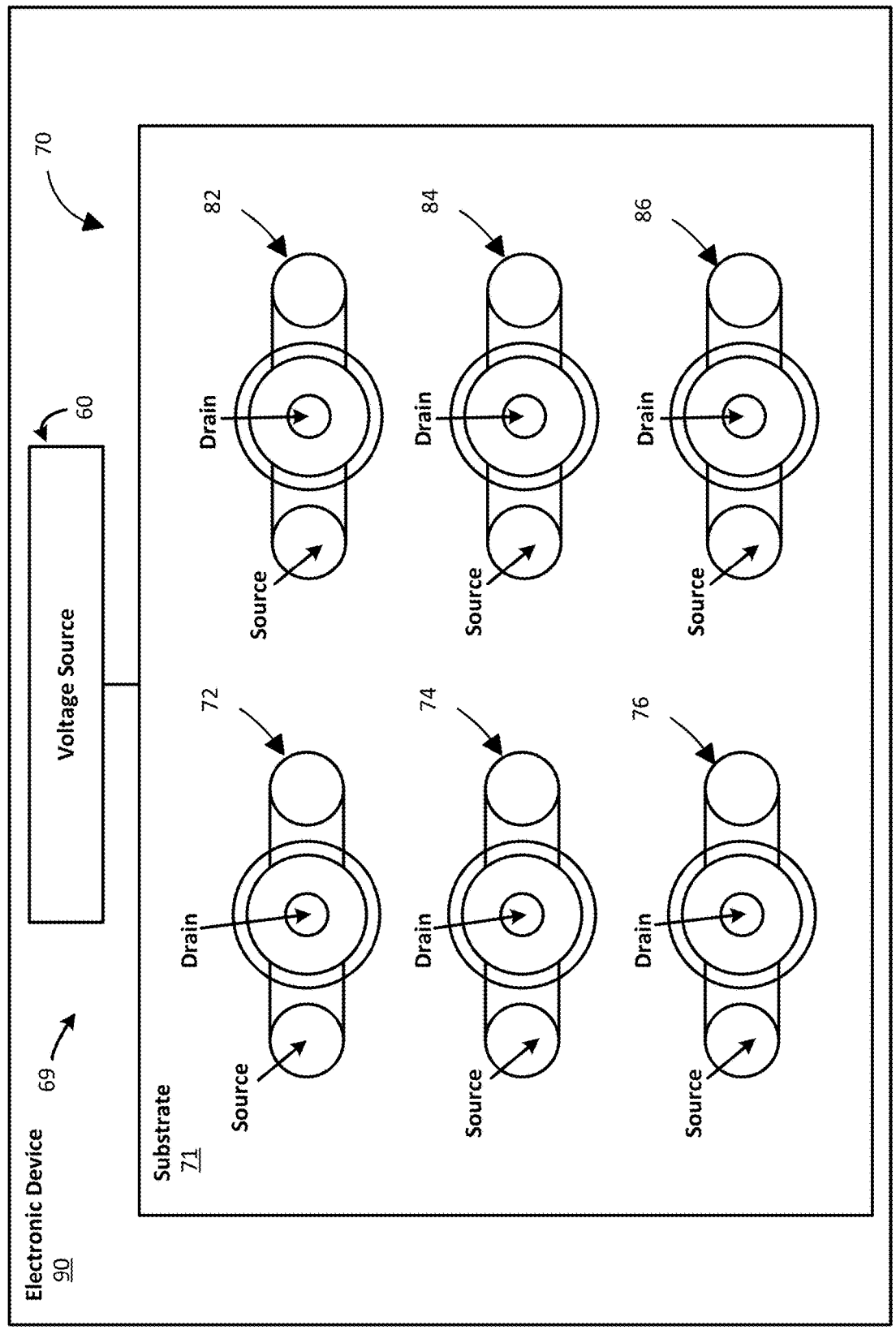
FIG. 11 shows an exemplary electronic device in accordance with some embodiments of the present disclosure.

In some embodiments, the first threshold and second threshold are based on a desired performance of the TFT 5 when the voltage is applied (e.g., via voltage source 60, FIG. 11 or other voltage source). For example, the first threshold may be based on an approximate maximum variation of the transfer characteristic value that may occur while still permitting the TFT to perform as a transistor or, alternatively, on a desired performance of the TFT. Exemplary transfer characteristic values are described in further detail with regard to FIGS. 7A-7C, 8A-8B, 17A-17D and 20. Similarly, the second threshold may be based on an approximate maximum variation of an output characteristic value that may occur while still permitting the TFT to perform as a transistor or, alternatively, on a desired performance of the TFT. Exemplary output characteristic values are described in further detail with regard to FIGS. 9A-9B, 15A-15G, and 22. Some channel layer 10 aspects and characteristics may be based on other thresholds and threshold values in other embodiments. Further, channel layer 10 thicknesses and threshold displacement energies may be selected based on other criteria in other embodiments.

In an embodiment, annealing of the layer may be based on a determination of a dose of radiation that is expected to irradiate the layer. The layer may have a thickness and threshold displacement energies after the annealing such that when the dose irradiates the layer, a change in performance of the thin-film transistor when a voltage is applied is less than a performance threshold. The performance threshold may be based on essentially any desired performance aspect of a TFT device such as a desired change between device performance before irradiation and after irradiation. The performance threshold may be indicative of a change before and after irradiation of any or various combinations of device performance aspects described herein, such as transfer characteristics, output characteristics, field effect mobility, or various combinations thereof.

To illustrate examples of some of the changes in device characteristics and performance following the annealing process annealing described above, discussion will turn briefly to FIGS. 8A, 8B, 9A, 9B, 10A and 10B, which are graphs that show exemplary data indicative of transfer characteristics and transistor output characteristics for channel layers annealed at various temperatures, as well as unannealed devices. The data in each of these figures is indicative of measurements of aspects and performance of devices having channel layers 10 with different thicknesses 22, including: (a) a ZnO channel layer approximately 200 nm thick and (b) a ZnO channel layer approximately 70 nm thick. The graphs in FIGS. 8A, 8B, 9A, 9B, 10A and 10B are also indicative of exemplary data of device performance for some embodiments of TFTs (e.g., TFT 5) fabricated as described herein using RF-sputtered ZnO film layers (e.g., channel layer 10), having the two different thicknesses above (e.g., approximately 70 nm and 200 nm) and annealed using different post annealing temperatures, as well as unannealed devices.

Figure 8B:
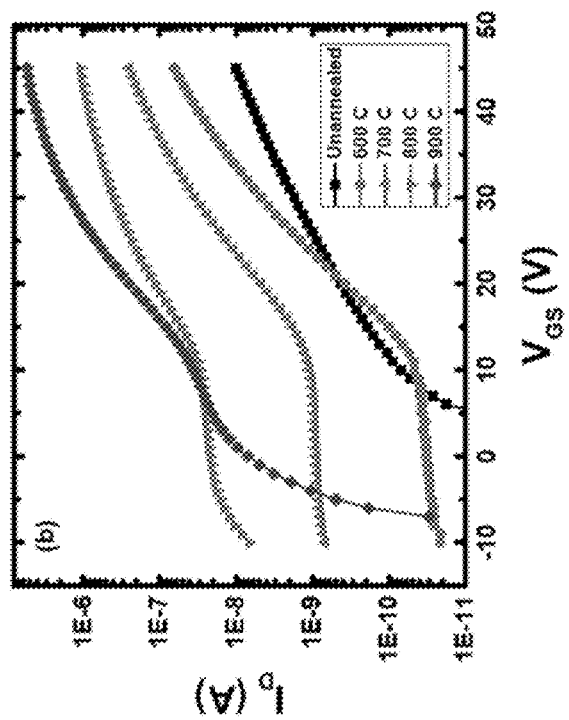
FIG. 8B is a graph showing transfer characteristics of a TFT device with a 70 nm channel layer and annealed at different temperatures in accordance with some embodiments of the present disclosure.
Figure 8A:
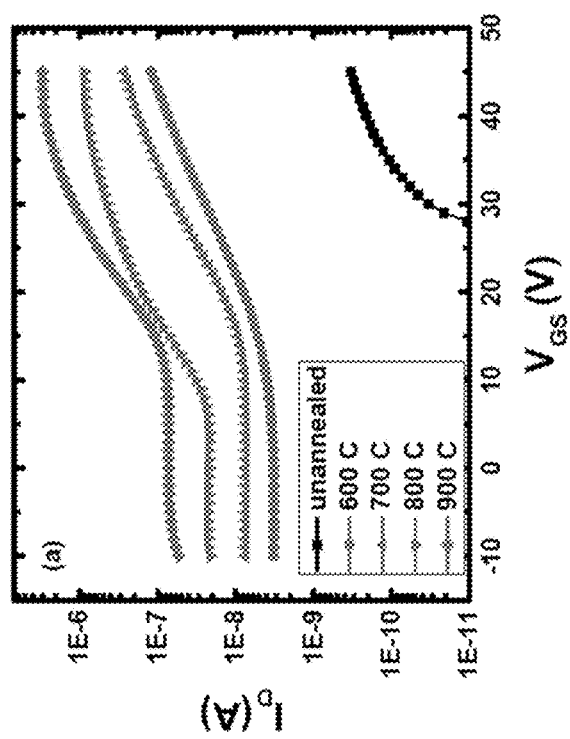
FIG. 8A is a graph showing transfer characteristics of a TFT device with a 200 nm channel layer and annealed at different temperatures in accordance with some embodiments of the present disclosure.

FIG. 8A is a graph showing transfer characteristics of a TFT device 5 with a 200 nm channel layer 10 and annealed at different temperatures, and FIG. 8B is a graph showing transfer characteristics of a TFT device 5 with a 70 nm channel layer 10 and annealed at different temperatures in accordance with some embodiments of the present disclosure. It is an aspect of some embodiments of the present disclosure that transfer characteristics for the devices with two different channel layers 10 of two different thicknesses and annealed at different annealing temperatures may generally correspond to the data indicated in FIG. 8A (200 nm) and FIG. 8B (70 nm). In some embodiments, devices (e.g., TFT 5) comprising channel layers 10 having the two different thicknesses generally may exhibit normally-on transistor behavior. As can be seen from the figures, the off current ($I_{OFF}$) for a TFT with a 70 nm thick ZnO channel layer 10 is lower than that with a thickness of 200 nm. In addition, it has been observed that off current ($I_{OFF}$) may increase as annealing temperature increases.

Figure 9B:
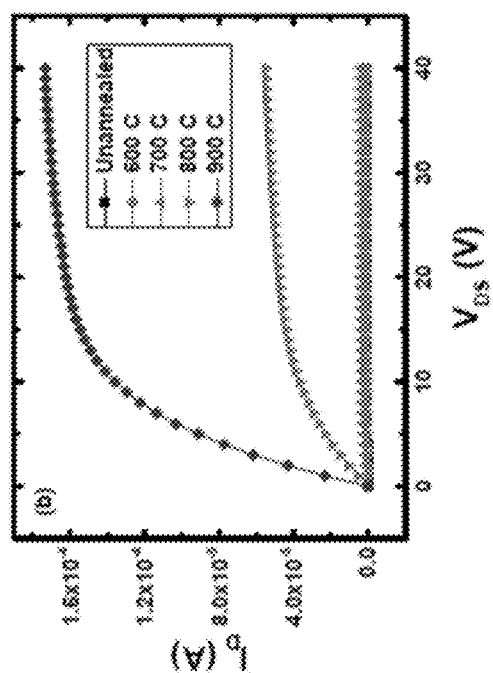
FIG. 9B is a graph showing transistor output characteristics at 35V of a TFT device with a 70 nm channel layer and annealed at different temperatures in accordance with some embodiments of the present disclosure.
Figure 9A:
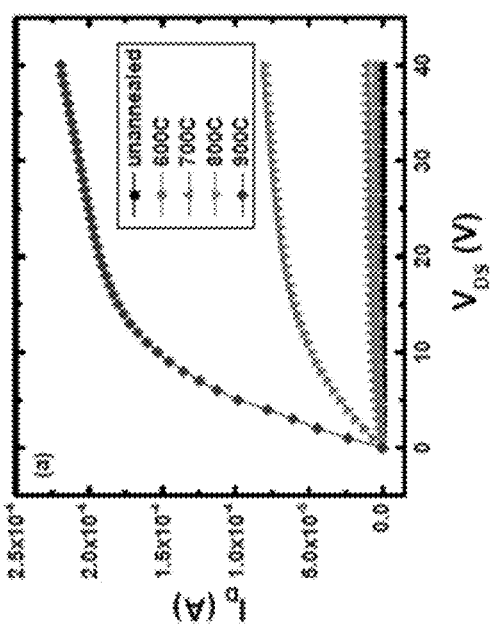
FIG. 9A is a graph showing transistor output characteristics at 35V of a TFT device with a 200 nm channel layer and annealed at different temperatures in accordance with some embodiments of the present disclosure.

FIG. 9A is a graph showing transistor output characteristics at 35V of a TFT device with a 200 nm channel layer and annealed at different temperatures, while FIG. 9B is a graph showing transistor output characteristics at 35V of a TFT device with a 70 nm channel layer and annealed at different temperatures in accordance with some embodiments of the present disclosure. The graphs show the transistor output characteristics extracted at $V_{GS}$=35V for different annealing temperatures of: (a) 200 nm ZnO sample (FIG. 9A) and (b) 70 nm ZnO sample (FIG. 9B). As can be seen from the figures, the saturation current ($I_{sat}$) may increase as annealing temperature increases. Therefore, higher annealing temperature may facilitate a higher on-to-off current ratio for devices fabricated according to some embodiments described herein.

Figure 10A:
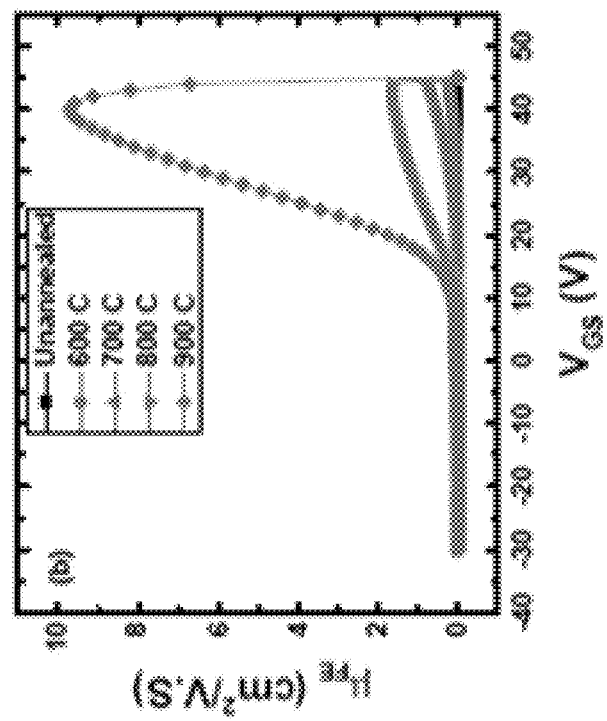
FIG. 10A is a graph showing field effect mobility versus gate bias for different annealing temperatures of a 200 nm channel layer in accordance with some embodiments of the present disclosure.
Figure 10B:
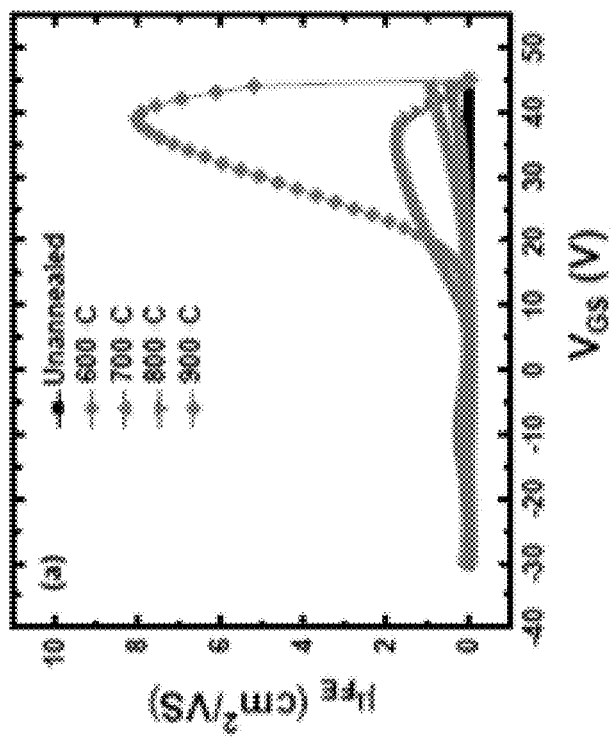
FIG. 10B is a graph showing field effect mobility versus gate bias for different annealing temperatures of a 70 nm channel layer in accordance with some embodiments of the present disclosure.

FIG. 10A is a graph showing field effect mobility versus gate bias for different annealing temperatures of a 200 nm channel layer 10, while FIG. 10B is a graph showing field effect mobility versus gate bias for different annealing temperatures of a 70 nm channel layer 10 in accordance with some embodiments of the present disclosure. It has also been observed that field effect mobility ("µFE") increases as annealing temperature increases. For example, for a sample TFT device having a channel layer 10 annealed at 900° C., a significantly higher µFE may be observed than when compared with µFE observed for TFT devices having a channel layer 10 annealed at other, lower temperatures.

Additional discussion and experimental data regarding effects of annealing and annealing temperature on radiation hardness of a channel layer 10 is provided with regard to FIGS. 5A-5D FIGS. 6A-6D, and FIGS. 7A-7C below.

Figure 3:
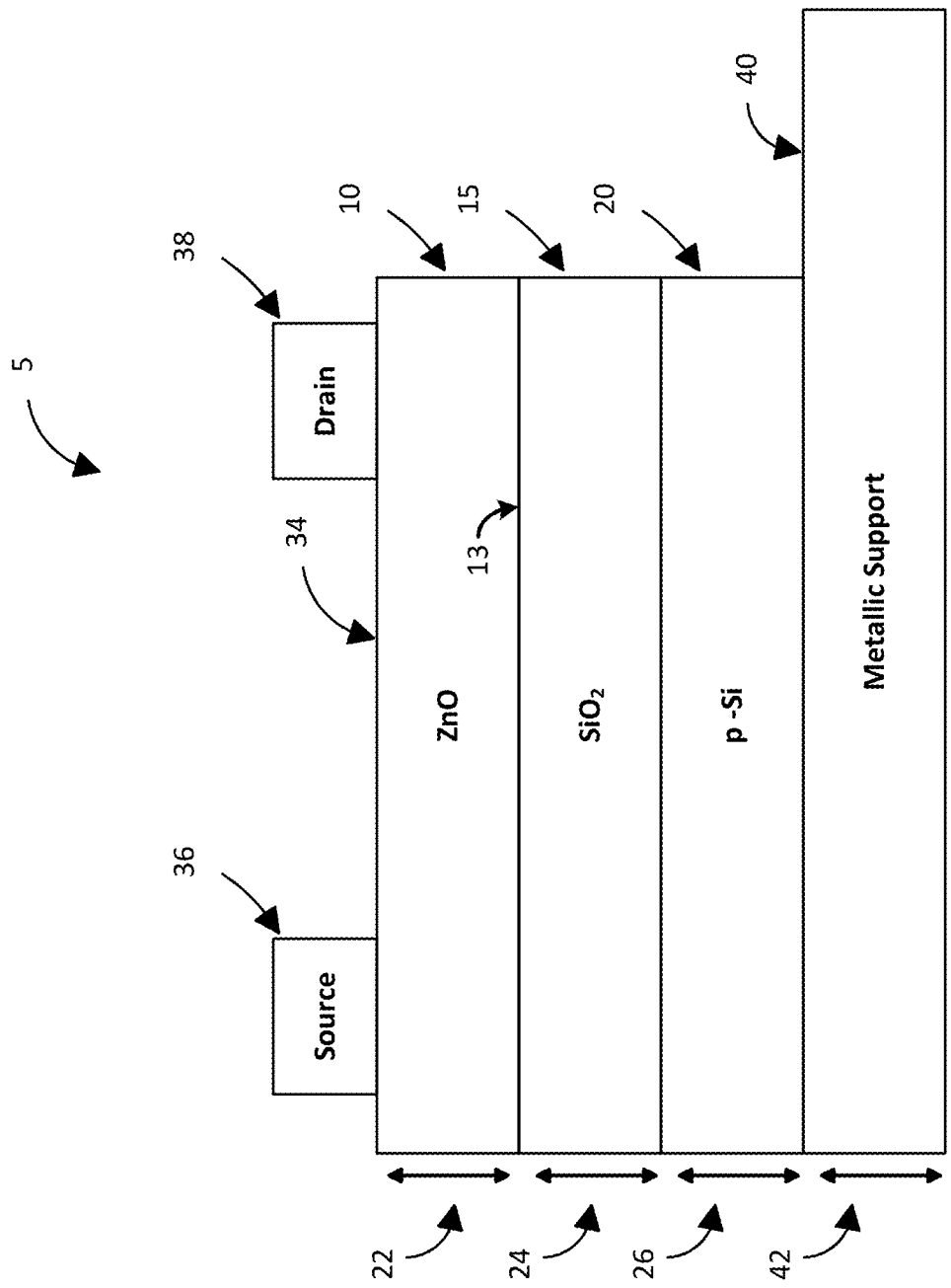
FIG. 3 shows a side view of an exemplary thin-film transistor device in accordance with some embodiments of the present disclosure.

FIG. 3 shows a side-view of an exemplary thin-film transistor device in accordance with some embodiments of the present disclosure. The thin-film stack 3 of FIGS. 1-2, includes a channel layer 10, dielectric layer 15 and silicon wafer 20 that is attached to a metallic support layer 40, which has a thickness 42. The TFT 5 of FIG. 3 is configured as a bottom-gate circular ZnO TFT, but other configurations are possible in other embodiments. In the illustrated embodiment, the channel layer 10 comprises highly crystalline ZnO that has been annealed at a temperature of at least 600° C. The TFT 5 of FIG. 3 also has a source 36 and drain 38.

The metallic support layer 40 illustrated in the embodiment illustrated by the figures comprises a gold-plated ceramic pad, but in other embodiments the metallic support layer 40 can comprise one or more other materials. The metallic support layer 40 also may be configured to form one or more gate electrodes of the TFT 5 for electrical measurements when the gate dielectric layer 15 and Si wafer 20 are also attached to the metallic support layer 40.

In some embodiments, the TFT 5 may be fabricated by providing one or more highly doped p-type Si wafers 20, and dry oxidizing the one or more wafers 20 to form dielectric layer 15, which comprises $SiO_2$ and acts a gate insulator. The dielectric layer 15 in the illustrated embodiment has a thickness 24 of approximately 100 nm. A channel layer 10 comprising ZnO thin film with a thickness 22 of approximately 70 nm may then be deposited via RF magnetron sputtering as described herein (e.g., to form stack 3 of FIGS. 1-2). The sputtered wafer may be diced into 1×1 cm pieces and cleaned with acetone, methanol, and deionized water in the ultrasonic bath, followed by drying with nitrogen ("$N_2$").

The stack 3 may then be post annealed at different temperatures ranging from approximately 200° C. to 900° C. prior to TFT fabrication. As an example, the stack 3 may be annealed at approximately 700° C. for approximately one hour. In order to isolate the device, a buffered oxide etch ("BOE") solution may be used to form a mesa structure, and a bottom side of the stack 3 may be etched through BOE to expose a portion of the Si wafer 20.

In some embodiments, device structures of the TFT 5 may be photolithographically defined on chemically cleaned ZnO samples, and a titanium ("Ti") and palladium ("Pd") bi-metallic stack may be deposited as source 36 and drain 38 ohmic contacts via direct-current ("DC") sputtering, followed by a lift-off process. Various materials may be used as ohmic contacts for source 36 and drain 38 in other embodiments. As an illustration, it has been observed through experimental data suggesting that iridium ("Ir") can withstand radiation, and if desired, Ti and Ir ohmic may be used for contacts 36, 38 in devices exposed to proton irradiation. In some embodiments, a metallic contacts for the source 36, drain 38 and gate (e.g., metallic support 40) may be used, and may be deposited using techniques such as evaporation. Yet other materials and combinations of materials may be possible to achieve a desired performance or the functionality of the TFT devices described herein.

In addition, if desired, unintentionally grown oxide on a back side of the Si wafer 20 may be removed and a conducting silver paste (not specifically shown) may be applied to the back side of the Si wafer 20 to attach the sample to a gold plated ceramic pad (e.g., metallic support layer 40), thereby forming one or more gate electrodes (not specifically shown) for electrical measurements.

The process above may be repeated as desired to fabricate a desired quantity of TFTs 5, such as when fabricating TFTs for use in a circuit of an electronic device, as described further below.

Figure 4:
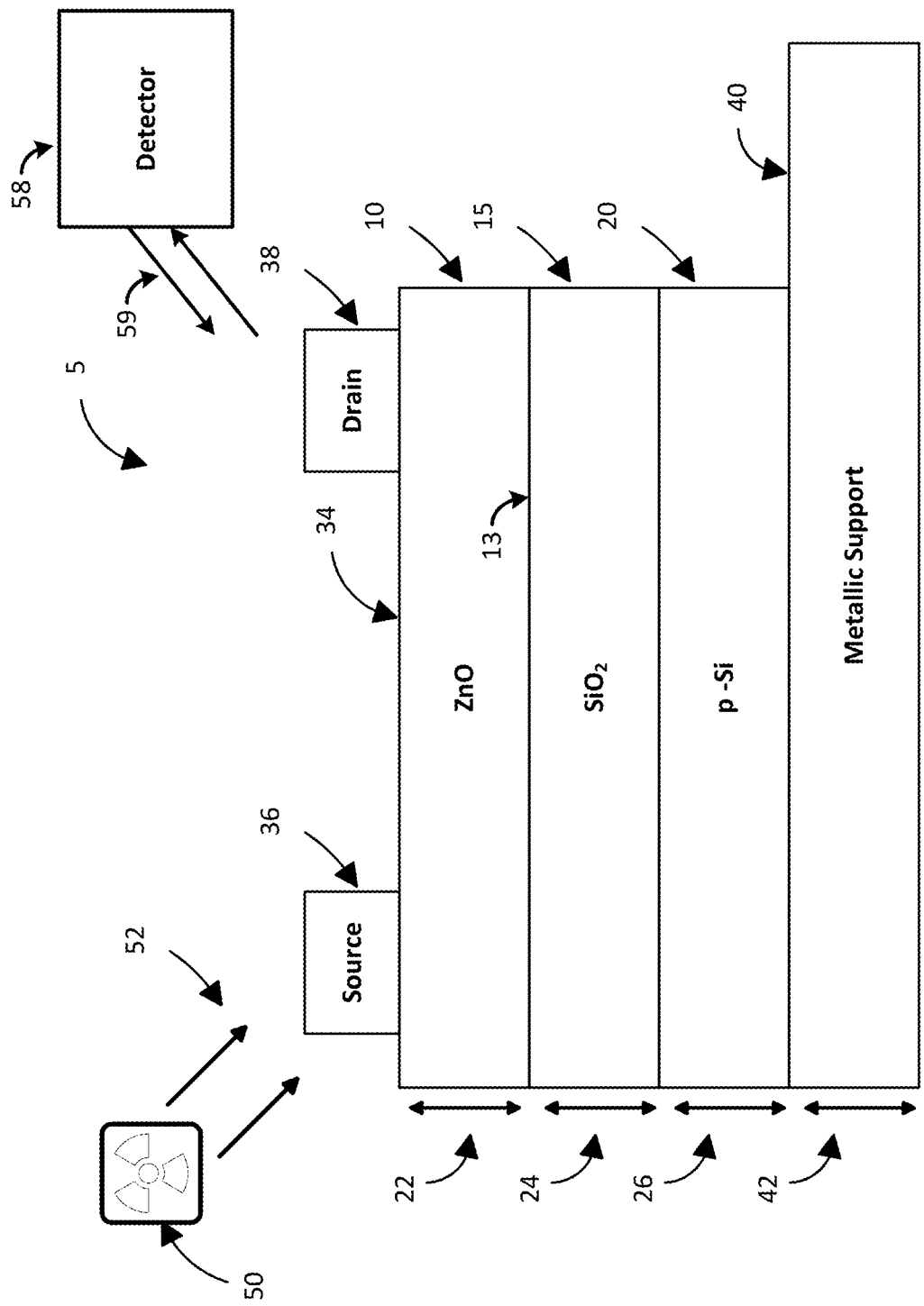
FIG. 4 shows a side view of an exemplary thin-film transistor device and a radiation source in accordance with some embodiments of the present disclosure.

FIG. 4 shows a side-view of an exemplary thin-film transistor device and a radiation source in accordance with some embodiments of the present disclosure. The embodiment of FIG. 4 includes a TFT 5, a radiation source 50 and a detector 58. In the illustrated embodiment, the radiation source 50 is configured to irradiate the TFT 5 by emitting a dose 52 of radiation. The detector 58 is configured to measure one or more of the various characteristics of the TFT 5 described herein both before and after the irradiation of the TFT 5 occurs.

The radiation source 50 is exemplary of various sources of radiation, and hence may include one or more radiation sources and can be various types of radiation, including combinations thereof. The radiation source 50 can be a naturally occurring source of radiation, man-made source of radiation, or combinations thereof, and may emit a dose 52 comprising various types of radiation described below. As a non-limiting example, the radiation source 50 may be a man-made source of radiation such as one or more radioactive components of a nuclear reactor at a nuclear energy facility. Another example may be a radiation-emitting machine such as an x-ray emitting device. In an embodiment, the source 50 may be a Pelletron accelerator in a tandem source configuration. In addition, radiation source 50 may be a naturally occurring source of radiation, such as the previously mentioned Van Allen radiation belts, solar particles, other cosmic radiation, etc. Although a single radiation source 50 is pictured, it will be understood that one or more radiation sources 50 may be present and that each may emit one or more doses 52 of radiation of various types. Yet other types of naturally and non-naturally occurring radiation sources 50 are contemplated within the scope of this disclosure. In some situations, radiation of a dose 52 from the radiation source 50 may be present in an environment, and irradiation of the TFT 5 may occur when the TFT enters the environment. Other structures in addition to the radiation source 50 and TFT 5 may be present in some embodiments in order to achieve the functionality described herein.

It will be understood that the dose 52 can include essentially any or a combination of various types of radiation, such as alpha, beta, neutron, and electromagnetic radiation. In some embodiments, the dose 52 may comprise as proton radiation, electron radiation, gamma ray radiation, ion radiation, neutron radiation, or other types of radiation. In addition, the dose 52 can have various characteristics (e.g., fluence, intensity, magnitude, etc.) including approximately the values described below (e.g., 200 keV proton beam of $1 \times 10^{14}$ protons/cm$^2$). However, it will understood that a device such as a stack 3 or TFT 5 may be exposed to a dose 52 of virtually any type and intensity of radiation, or various combinations thereof, and so this disclosure's recitations of radiation characteristics (e.g., types and intensity values) is provided for illustrative purposes only and is non-limiting.

The detector 58 may be configured to detect various aspects of the characteristics, performance and properties of the TFT 5. Although a single detector 58 is pictured in FIG. 4, it will be understood that one or more detectors 58 may be used in some embodiments in order to achieve the functionality described herein. In the illustrated embodiment, the detector 58 is a spectrometer configured to perform Raman spectroscopy via signal 59. An example device implemented by detector 58 may be a Jobin Yvon spectrometer or other device. The detector 58 sends and receives signal 59, which is a Raman signal in the instant embodiment, and is indicative of characteristics of the TFT 5 (e.g., physical, electrical, or other characteristics). In other embodiments, the detector 58 may emit other types of signals 59, which may be configured to measure or detect any or various combinations of the aspects and performance of TFT 5 described herein.

It is an aspect of some embodiments of the present disclosure to compare characteristics of TFT device 5 before and after irradiation based on measurements taken by the detector 58 in order to determine or evaluate aspects of the device's radiation hardness.

To further illustrate exemplary effects of annealing temperature on radiation hardness of a channel layer 10, graphs and surface topography measurements are included in FIGS. 5A, 5B, 6A, 6B, and 7A-7C. These figures are indicative of aspects of a first plurality of devices with ZnO channel layers 10 (e.g., stack 3, TFT 5, or various combinations thereof) irradiated with a dose 52 of gamma-ray radiation from radiation source 50. A second plurality of devices with ZnO channel layers 10 were unirradiated and kept as reference samples. The first and second pluralities of devices in the embodiment of the figures include at least a ZnO thin-film channel layer 10, such as a stack 3, but in other embodiments, the first and second plurality of devices may be similar to a fully-fabricated TFT 5. In the instant embodiment, the dose 52 comprises a 100 MRad dose gamma rays, and radiation source 50 is a Co-60 source. In the embodiment of the figures, room-temperature Raman spectroscopy analysis was performed on both the first plurality of devices and second plurality of devices after irradiation of the first plurality of devices.

Figure 5A:
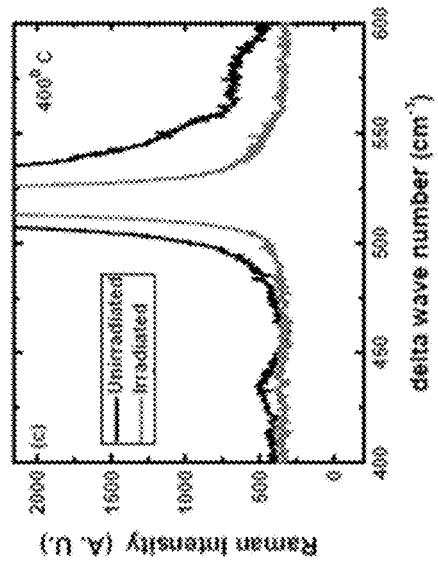
FIG. 5A is a graph showing Raman spectroscopic analysis of a ZnO film annealed at 200° C. in accordance with some embodiments of the present disclosure.
Figure 5B:
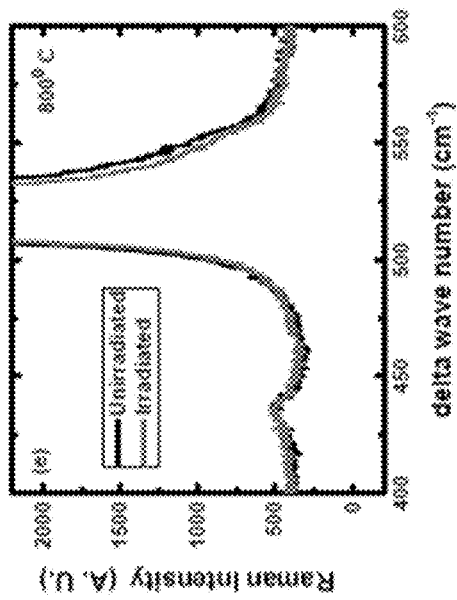
FIG. 5B is a graph showing Raman spectroscopic analysis of a ZnO film annealed at 400° C. in accordance with some embodiments of the present disclosure.
Figure 5C:
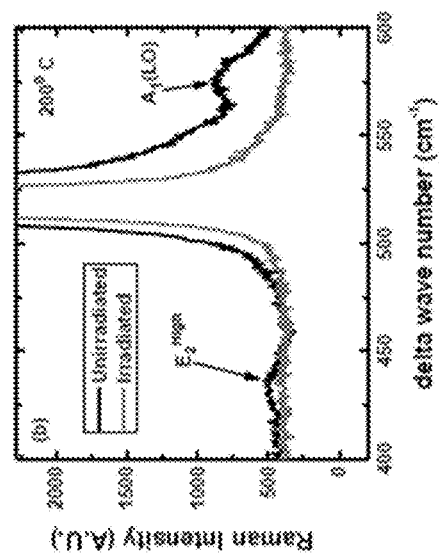
FIG. 5C is a graph showing Raman spectroscopic analysis of a ZnO film annealed at 600° C. in accordance with some embodiments of the present disclosure.
Figure 5D:
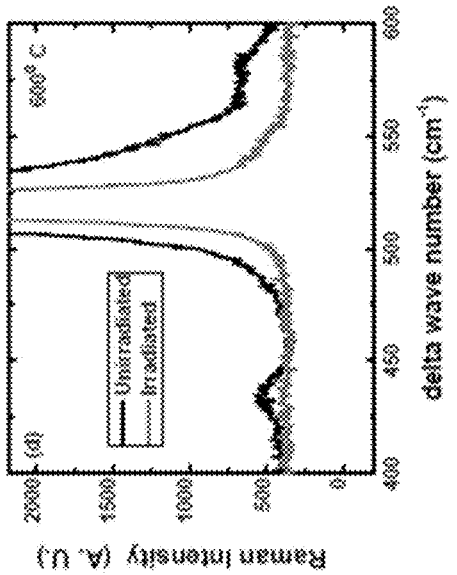
FIG. 5D is a graph showing Raman spectroscopic analysis of a ZnO film annealed at 800° C. in accordance with some embodiments of the present disclosure.
Figure 6B:
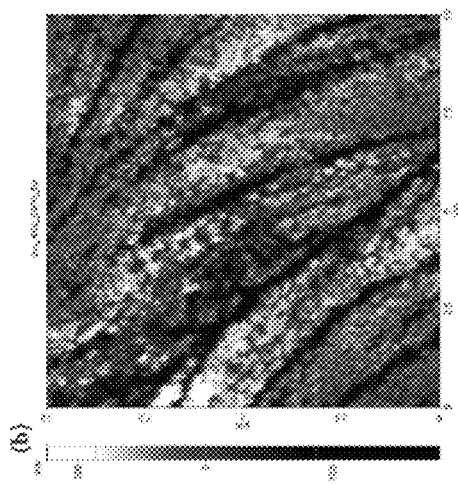
FIG. 6B depicts surface topography of irradiated ZnO film annealed at 400° C. in accordance with some embodiments of the present disclosure.
Figure 6D:
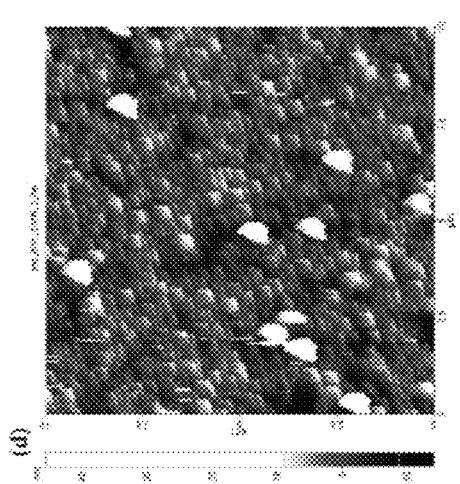
FIG. 6D depicts surface topography of irradiated ZnO film annealed at 800° C. in accordance with some embodiments of the present disclosure.
Figure 6A:
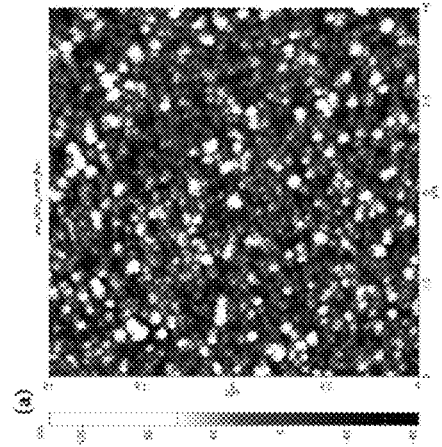
FIG. 6A depicts surface topography of irradiated ZnO film annealed at 200° C. in accordance with some embodiments of the present disclosure.
Figure 6C:
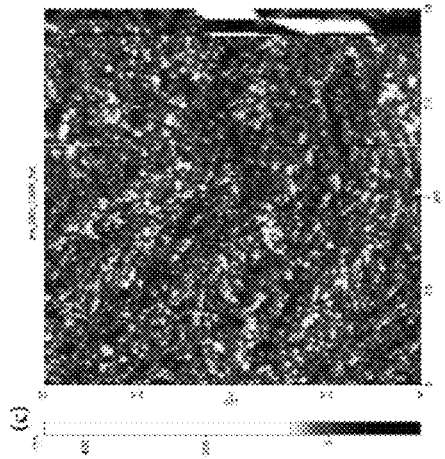
FIG. 6C depicts surface topography of irradiated ZnO film annealed at 600° C. in accordance with some embodiments of the present disclosure.

FIG. 5A is a graph showing Raman spectroscopic analysis of a ZnO film annealed at 200° C. in accordance with some embodiments of the present disclosure. The graph illustrates room temperature Raman spectra for unirradiated and irradiated TFT 5 with annealing temperatures of approximately: (a) 200° C. (FIG. 5A), (b) 400° C. (FIG. 5B), (c) 600° C. (FIG. 5C), and (d) 800° C. (FIG. 5D). As shown in the figures, a significant degradation Raman spectra may be observed for irradiated samples annealed at lower than approximately 800° C. However, a device (from the first plurality of devices) annealed at approximately 800° C. sample may show higher radiation tolerance with a reduced deviation in Raman spectra from its reference device sample (from the second plurality of devices). A constant peak intensity and full width half maximum ("FWHM") are indicative of a reduction in severe damage to a lattice structure of a device from the first plurality of devices annealed at approximately 800° C. as opposed to the devices from the first plurality of devices annealed at a temperature lower than 800° C. Peak intensity and the FWHM values for both unirradiated and irradiated samples may be comparable for 800° C. samples as well. Thus, an aspect of the utility of some embodiments of the present disclosure is that ZnO radiation hardness is dependent on crystallinity of the ZnO film.

FIGS. 6A-6D depict surface topography of irradiated ZnO film annealed at 200° C., 400° C., 600° C., and 800° C., respectively, in accordance with some embodiments of the present disclosure. An aspect of some embodiments of the present disclosure may be apparent upon examination of surface topography of irradiated devices from the first plurality of devices described above with regard to FIGS. 5A-5D. It has been observed that surface roughness of the first plurality of devices may increase systematically when annealing temperature decreases. Thus, a surface of a device of the first plurality of devices having a lower annealing temperature sample may be prone to be damage by incident photons. In the embodiment of the figures, a root-mean square ("RMS") surface roughness value for the respective devices of the first plurality of devices were approximately: 32.13 nm, 43.88 nm, 24.58 nm and 4.48 nm for annealing temperatures of 200° C. (FIG. 6A), 400° C. (FIG. 6B), 600° C. (FIG. 6C) and 800° C. (FIG. 6D), respectively. A larger deviation of the surface roughness from 800° C. to lower temperatures may indicate that least displacement damage by incident photons occurred on highly crystalline ZnO surfaces.

Following the irradiation process and surface topography measurement process above, first and second pluralities of TFT devices (e.g., TFT 5) may be fabricated using the irradiated samples (e.g., first plurality of devices) and reference samples (e.g., second plurality of devices) to study electrical characteristics of the plurality of before and after irradiation. In some embodiments, radiation damage on metal and/or metal-semiconductors via diffusion may occur during gamma-ray irradiation. In order to exclude effects of gamma-ray irradiation on ohmic contacts and/or metal-semiconductor interfaces, fabrication of both the first and second pluralities of TFT devices fabrication was performed after irradiating each ZnO/SiO2/Si wafer of the first plurality of devices described above. It has been observed that, in an embodiment, exposure of a TFT device fabricated using a device of the first plurality of devices to an elevated temperature required for the TFT fabrication process may not anneal out radiation induced defects. Therefore, it is reasonable to assume that device characteristics observed in the figures fully reflect the radiation induced effects on ZnO TFTs.

Figure 7B:
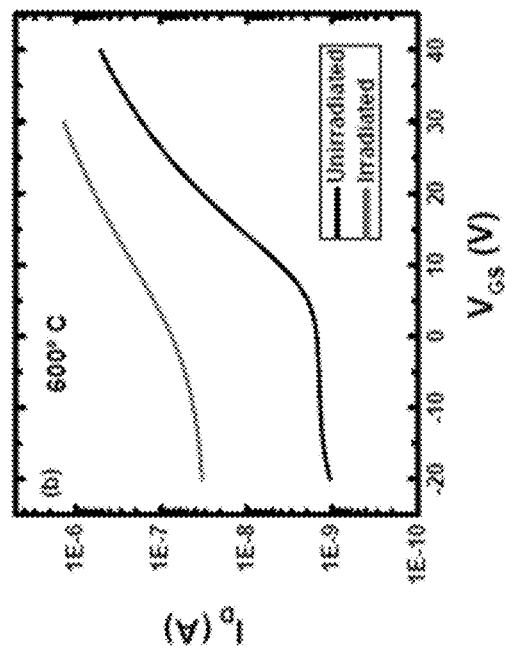
FIG. 7B is a graph depicting transfer characteristics of irradiated and unirradiated ZnO film annealed at 600° C. in accordance with some embodiments of the present disclosure.
Figure 7A:
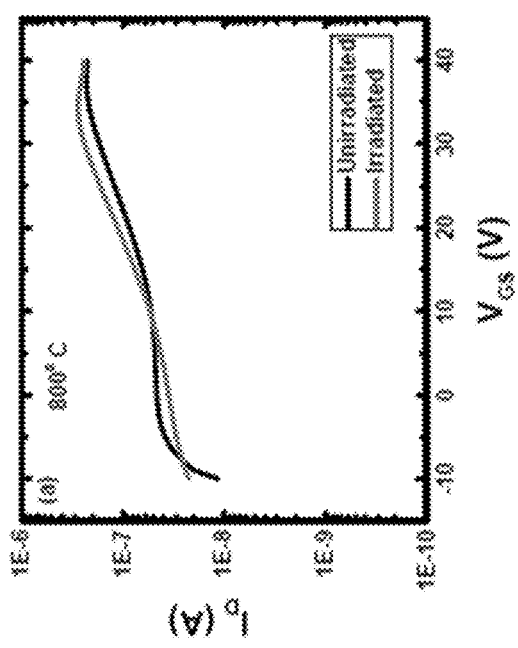
FIG. 7A is a graph depicting transfer characteristics of irradiated and unirradiated ZnO film annealed at 800° C. in accordance with some embodiments of the present disclosure.
Figure 7C:
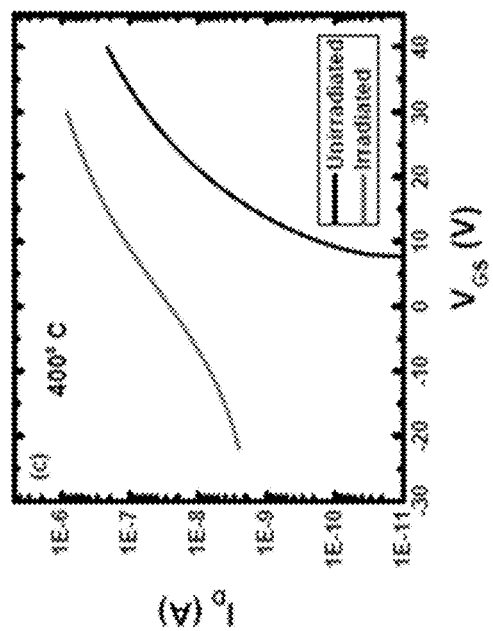
FIG. 7C is a graph depicting transfer characteristics of irradiated and unirradiated ZnO film annealed at 400° C. in accordance with some embodiments of the present disclosure.

FIG. 7A-7C are graphs depicting transfer exemplary characteristics of irradiated and unirradiated ZnO film annealed at 800° C., 600° C. and 400° C., respectively, in accordance with some embodiments of the present disclosure. It has been observed that ZnO film annealed at 200° C. sample may fail to yield transfer characteristics resembling characteristics of a transistor characteristics. As shown in the figures, an on-voltage $V_{ON}$ value may be essentially consistent for each of the annealed reference samples (second plurality of devices described above), and on current $I_{ON}$ also be essentially consistent despite a difference in annealing temperature between the embodiments shown by the figures. However, as indicated in the figures, a degradation of $I_{OFF}$ may occur as a temperature at which the device is annealed lowers, which may indicate severe surface damage to those samples during gamma ray exposure. In an aspect of the embodiment of the figures, a TFT devices having a higher annealing temperature may be able to show tolerance toward a dose of approximately 100 MRad of gamma ray radiation, although a TFT device may be annealed at a temperature capable of showing tolerance toward doses of other values in other embodiments. In addition, TFT devices annealed at higher temperatures may exhibit a reduced shift to a negative gate bias direction of $V_{ON}$. Moreover, a deviation of $I_{OFF}$ of irradiated TFT devices from a corresponding $I_{OFF}$ of unirradiated value TFT devices may increase with decreasing annealing temperature. Based on the Raman analysis and transfer characteristics observed in the embodiment of the figures, radiation tolerance may be related to grain size for TFT devices comprising ZnO films as well as for TFT devices comprising films of other types of materials.

FIG. 11 shows an exemplary electronic device in accordance with some embodiments of the present disclosure. The illustrated embodiment of the electronic device 90 includes an array 70 of thin-film transistor devices 72, 74, 76, 82, 84 and 86 that have been coupled to or deposited onto a substrate 71 to form a portion of a logic circuit 69. The device 90 can include additional components and hardware not specifically described herein but that will be understood upon reading this disclosure, such as when electronic device 90 is a mobile device 91, flat panel display 92, or avionics system 93 as described with reference to FIG. 12.

The electronic device 90 has a voltage source 60 that provides a voltage to a logic circuit 69 for carrying out operation of the electronic device 90. The voltage source 60 may be configured to provide various voltage values, including common voltage values such as approximately 6V, 12V, 24V, or otherwise. In an embodiment, the voltage source 60 is coupled to substrate 71 and is configured to provide a voltage to array 70 and to generally provide voltage for powering other resources of the electronic device 90. In the illustrated embodiment, the voltage source 60 is depicted as a single voltage source that is contained within the electronic device 90, such as a battery or other onboard power supply, but in other embodiments, the voltage source 60 can be one or more sources of voltage or power configured to power the electronic device 90. The voltage source 60 also may be located off-board the electronic device 90, such as a wall outlet or other external power or voltage supply. In some embodiments, the electronic device 90 can include suitable hardware for receiving a voltage from one or more voltage sources 60, and may include various types of hardware and interfaces in order to achieve the functionality described herein.

The array 70 includes TFT devices 72, 74, 76, 82, 84 and 86 in the illustrated embodiment are configured as bottom-gate TFT devices similar to TFT 5. As noted above, each of the TFT devices 72, 74, 76, 82, 84 and 86 has a source and a drain, with a dielectric gate (e.g., $SiO_2$ layer 15). The array 70 may include other types of TFTs in other embodiments. The devices 72, 74, 76, 82, 84 and 86 may not be shown to scale, and are representative and illustrative of some embodiments of the present disclosure. It will be understood that appearance and features of the devices may vary from what is shown in FIG. 11 in some embodiments.

The array 70 is positioned on substrate 71, which is configured to support the TFTs of the array 70 (e.g., a chip). In some embodiments, the substrate 71 may be conductive, such as metallic support 40 (FIGS. 1-4). In some embodiments, the substrate 71 may be a circuit board or other component for supporting TFTs of the array and facilitating the functionality ascribed herein to the array 70 and electronic device 90.

The logic circuit 69 in the illustrated embodiment includes at least the voltage supply 60 and one or more TFTs of the array 70. In an embodiment, the one or more TFTs of the array 70 may be coupled and a part of the logic circuit 69. In some embodiments, the logic circuit 69 can include other components, such as one or more additional arrays, a controller, various interfaces or other resources of the electronic device 90. As an example, the logic circuit 69 may be coupled to receive an input from a user and provide an output indicative of a response based on the input. The logic circuit 69 can have other functionality as will be appreciated upon reading of this disclosure.

The logic circuit 69 may be configured as part of a control circuit (not specifically shown) of the electronic device 90 and may be configured to facilitate control of the device 90. A control circuit of the device 90 can include various types of hardware, software or combinations thereof to achieve the functionality described herein. In some embodiments, the control circuit be coupled to memory of the electronic device 90, which can includes a main memory, such as a random access memory (RAM) or other dynamic storage device, coupled to the bus for storing information and instructions to be executed by the processor. Main memory also may be used for storing temporary variable or other intermediate information during execution of instructions to be executed by the processor. The control circuit further can be in communication with a read only memory (ROM) or other static storage device coupled to the bus for storing static information and instructions for the processor. A storage device, such as a magnetic disk or optical disk, is provided and coupled to the bus for storing information and instructions, such as control instructions that can include instructions that, when executed by the control circuit, cause the control circuit to perform operations comprising at least the functionality ascribed herein to the control circuit.

In some embodiments, the logic circuit 69 may be configured to assist in executing logic or instructions stored in memory, or a computer-readable medium. The term "computer-readable medium" as used herein refers to any medium that participates in providing instructions to the processor for execution. Such a medium may take many forms, including, but not limited to, non-volatile media, volatile media, and transmission media. Non-volatile media include, for example, optical or magnetic disks, such as the storage device. Volatile media include dynamic memory, such as the main memory. Transmission media include coaxial cables, copper wire, and fiber optics, including the wires that comprise the bus. Common forms of computer-readable media include, for example, flash memory, hard disk, magnetic tape, any other magnetic medium, a CD-ROM, DVD, any other optical medium, floppy disk, a flexible disk, punch cards, paper tape, any other physical medium with patterns of holes, a RAM, a PROM, an EPROM, a FLASH EPROM, any other memory chip or cartridge, or any other medium from which a computer can read.

Various forms of computer-readable media may be involved in carrying one or more sequences of one or more instructions to the processor for execution. For example, the instructions may initially be borne on a magnetic disk of a remote computer. A remote computer can load the instructions into its dynamic memory and send the instructions over a telephone line using a modem. In an embodiment, a modem local to electronic device 90 can receive the data on the telephone line and use an infrared transmitter to convert the data to an infrared signal. An infrared detector coupled to the bus can receive the data carried in the infrared signal and place the data on the bus. The bus carries the data to the main memory, from which the processor retrieves and executes the instructions. The instructions received by the main memory may optionally be stored on the storage device either before or after execution by the processor. The electronic device 90 also can include a communication interface coupled to the bus. The communication interface provides a two-way data communication coupling to a network link that is connected to a local network. For example, the communication interface may be an integrated services digital network (ISDN) card or a modem to provide a data communication connection to a corresponding type of telephone line. As another example, the communication interface may be a local area network (LAN) card to provide a data communication connection to a compatible LAN. Wireless links may also be implemented. In any such implementation, the communication interface sends and receives electrical, electromagnetic, or optical signals that carry digital data streams representing various type of information. The network link typically provides data communication through one or more networks to other data devices.

For example, the network link may provide a connection through the local network to the host computer or to data equipment operated by an Internet Service Provider (ISP). The ISP in turn provides data communication services through the worldwide packet data communication network, now commonly referred to as the "Internet." The local network and the Internet both use electrical, electromagnetic, or optical signals that carry digital data streams. The signals through the various networks and the signals on the network link and through the communication interface, which carry the digital data to and from electronic device 90, are exemplary forms of carrier waves transporting the information. The electronic device 90 can send messages and receive data, including program codes, through the network (s), the network link, and the communication interface. In the Internet example, a server might transmit a requested code for an application program through The Internet, the ISP, the local network, and the communication interface. In accordance with one aspect of the invention, one such downloaded application provides various applications facilitated by execution of logic at least in part by the logic circuit 69 or otherwise. The received code may be executed by the processor as it is received, and/or stored in the storage device, or other non-volatile storage for later execution. In this manner, in some embodiment, the electronic device 90 may obtain an application code in the form of a carrier wave.

Figure 12:
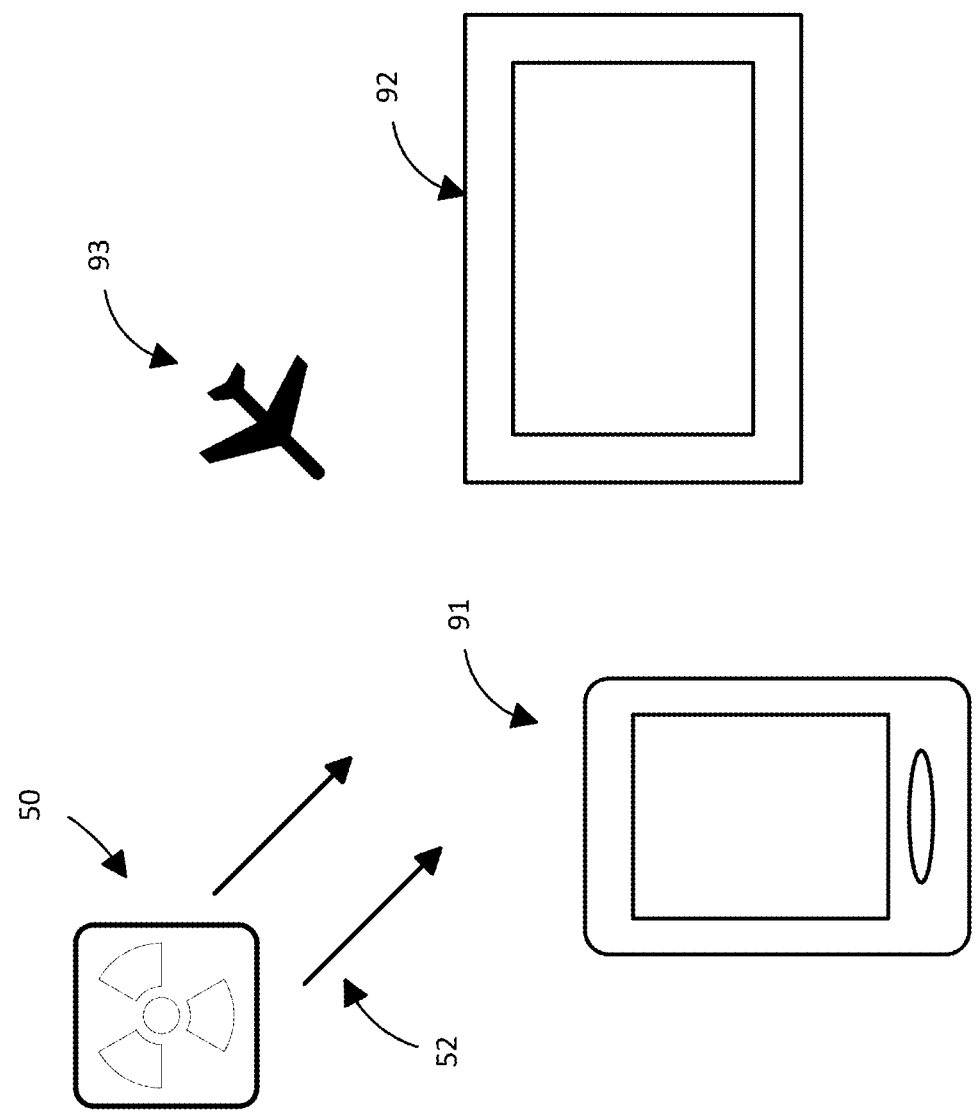
FIG. 12 shows exemplary electronic devices and a radiation source in accordance with some embodiments of the present disclosure.

FIG. 12 shows exemplary electronic devices and a radiation source in accordance with some embodiments of the present disclosure. As noted above, electronic devices used in a variety of applications may come into contact with radiation sources during operation. In the embodiment of the figure, exemplary electronic devices 90, include a mobile device 91, a flat panel display 92 and avionics system 93 are shown receiving a dose of radiation 52 from radiation source 50.

The inclusion of one or more arrays 70 fabricated with a plurality of TFTs according to the techniques described herein may allow one or more of the mobile device 91, a flat panel display 92 and avionics system 93 to remain operational at a desired capacity despite exposure to the dose 52 or even when undergoing additional irradiation. In this regard, the radiation-hard nature of the devices 90 may permit operation of such devices 90 to remain reliable despite exposure to various quantities and doses of radiation on one or more occasions, which often may occur transparently to a user of the device 90.

The radiation source 50 and dose 52 may have the features and characteristics ascribed herein to each, and may be present to irradiate each of the depicted mobile device 91, a flat panel display 92 and avionics system 93 individually, collectively, or various combinations thereof.

As noted above, the exemplary electronic devices 90 in the illustrated embodiment may include one or more components not specifically depicted in the figures, but that will be understood upon reading of this disclosure.

The mobile device 91 can be various types of wireless mobile devices, such as a smartphone (e.g., iPhone®, iPad®, Android® etc.), tablet, smartwatch, or other device. In an embodiment, the mobile device 91 includes a light emitting diodes display (LED), liquid crystal display (LCD) or other type of display, as well as various logic circuits and other components implementing one or more TFT arrays 70. Similarly, the flat panel display 92 can be configured to display information using various types of technology, such as a LED, LCD or other type of flat panel display as well as various logic circuits and other components implementing one or more TFT arrays 70.

Avionics system 93 can be various components of one or more systems used for flight operations of aircraft, spacecraft, or various combinations thereof. The operations of avionics system 93 may be critical to safe operation of an airborne vehicle, but may be exposed to high radiation levels from time to time. The avionics system 93 can comprise one or more electronic devices 90, each of which can include various quantities of TFTs as well as various logic circuits and other components implementing one or more TFT arrays 70. Thus, sensitive components may be fabricated using the radiation hardened techniques described herein. In some embodiments, the avionics system 93 comprises an LED, LCD or another type of display.

Note that the exemplary electronic devices 90 including a mobile device 91, a flat panel display 92 and avionics system 93 are described as mere examples of practical implementations of some embodiments of the present disclosure, and other types of electronic devices 90 are possible and contemplated within the scope of this disclosure. In some embodiments, various other types of electronic devices 90 and yet other applications are possible.

Figure 13:
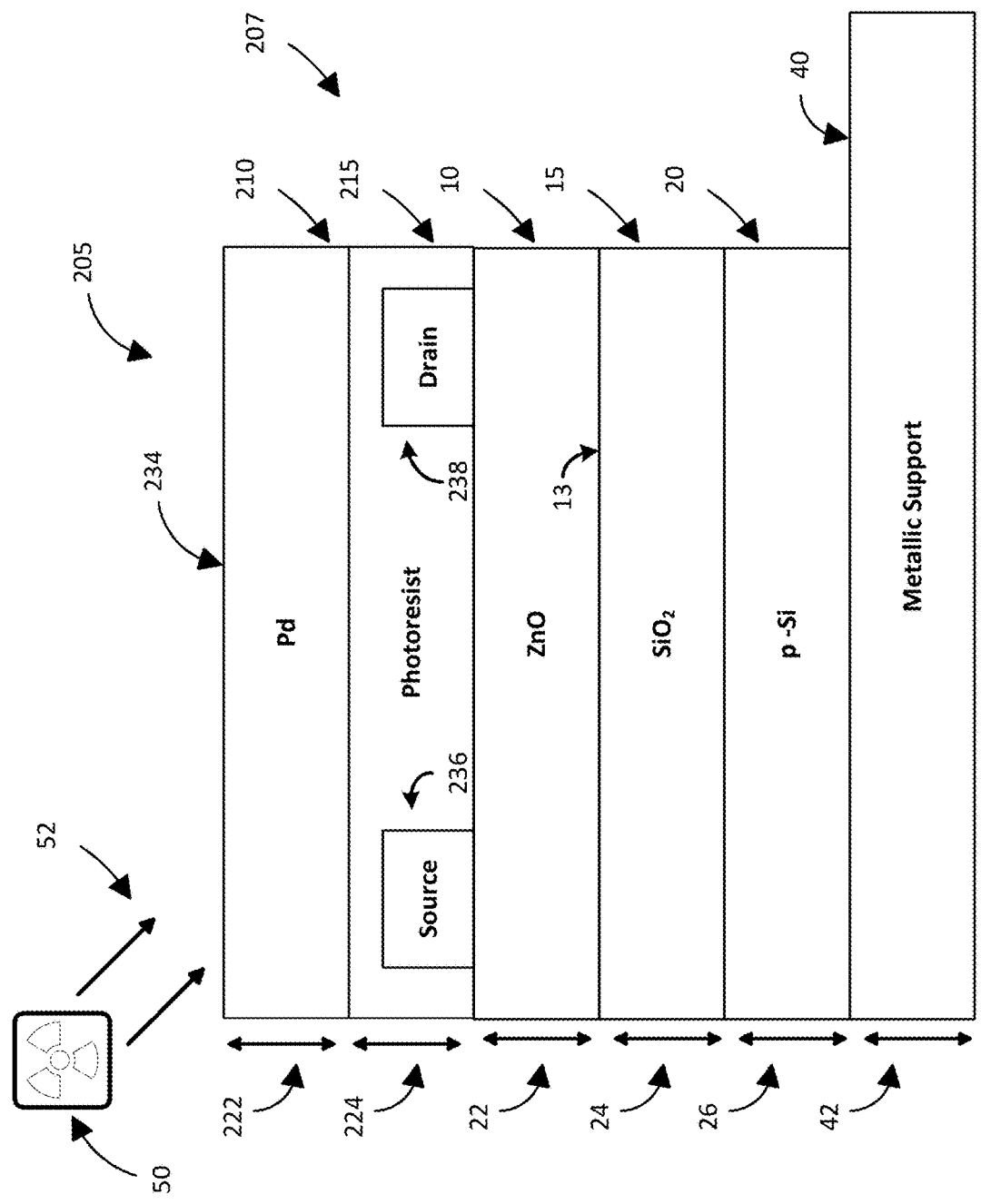
FIG. 13 shows a side-view of an alternate embodiment of a thin-film transistor device and a radiation source in accordance with some embodiments of the present disclosure.

FIG. 13 shows a side-view of an alternate embodiment of a thin-film transistor device and a radiation source in accordance with some embodiments of the present disclosure. The alternate embodiment of FIG. 13 may be used to permit a user to select a location within a TFT 205 which will receive a portion of dose 52 from the radiation source 50 that includes an approximate maximum concentration of the dose 52. The TFT 205 is similar to the embodiment of the stack 3 in FIGS. 1-2 and TFT 5 in FIGS. 3-4, except that a multi-layer passivation layer 207 has been added adjacent to the thin-film transistor 205. The TFT 205 otherwise has layers similar to those that otherwise make up TFT 5. The passivation layer 207 in the illustrated embodiment is configured to facilitate control of a location where portions of the dose 52 are concentrated within the TFT 205. The TFT 205 also has source 236 and drain contacts 238 configured to perform similarly to the source 36 and drain 38 of TFT 5. The TFT 205 may be configured to perform similarly to TFT 5 otherwise. Additional techniques and information for fabrication and performance of devices comprising a passivation layer are described in additional detail in U.S. Provisional Patent Application No. 62/691,987, filed Jun. 29, 2018 and entitled "Fabrication of Radiation Hard ZnO Transistors," the entire contents of which are hereby incorporated by reference herein in their entirety.

The passivation layer 207 has a thickness and material composition that have been selected such that, when a dose of radiation from the radiation source 50 irradiates the TFT 205, a portion of the dose 52 that includes an approximate maximum concentration of the dose 52 is located within the channel layer 10. In this regard, the passivation layer 207 includes a heavy element layer 210 and a photoresist layer 215. In some embodiments, the layer 210 and layer 215 may be configured to work together to buffer energetic protons without generating secondary radiation. The layer 207 may have similar functionality when the radiation dose 52 comprises other types of radiation.

The heavy element layer 210 may be configured facilitate control of irradiating particles (e.g., by slowing down particles and promote nuclear collisions in a desired portion of the TFT 205, such as channel layer 10). In the illustrated embodiment, the passivation layer 210 comprises palladium, but other materials are possible in other embodiments. Thickness 222 of the heavy element layer 210 may vary, but in some embodiments a thickness 222 may be approximately 140 nm or 106 nm for keV energy radiation, although other thicknesses 222 are possible for other radiation energies depending on a desired functionality of the passivation layer 207.

The passivation layer 207 also has a photoresist layer 215 that is configured to further control the irradiating particles of the dose 52. The photoresist layer 215 may be various types of materials, but in the illustrated embodiment, layer 215 includes an AZ 5214-e photoresist from AZ® Electronic Materials/Merck KGaA. A thickness 224 of the photoresist layer may be approximately 2.15 µm for keV radiation energies, although other thicknesses are possible in other embodiments.

In an embodiment, the photoresist layer 215 may be deposited (e.g., onto a stack 3 or TFT 5) by spin coating, followed by a sputter deposition of the heavy element layer 210.

Figures 14A, 14B:
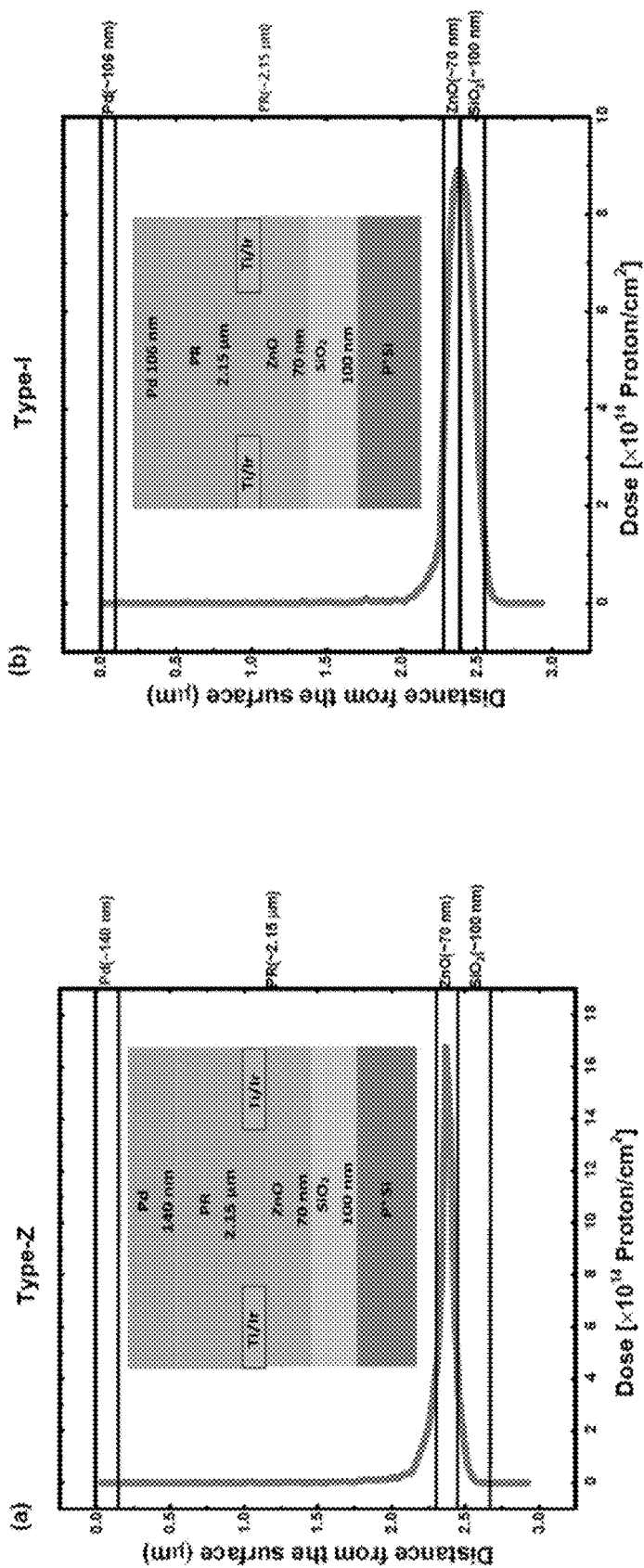
FIG. 14A is a graph showing a proton dose-depth profile for a TFT device having a passivation layer in accordance with some embodiments of the present disclosure.
FIG. 14B is a graph showing proton a dose-depth profile for a TFT device having a passivation layer in accordance with some embodiments of the present disclosure.
Figure 15B:
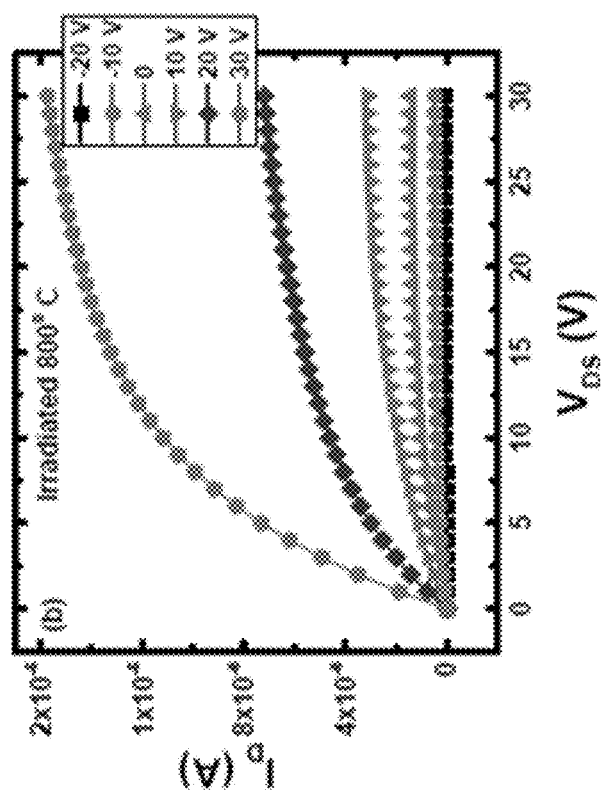
FIG. 15B is a graph depicting output characteristics of irradiated ZnO film annealed at 800° C. in accordance with some embodiments of the present disclosure.
Figure 15A:
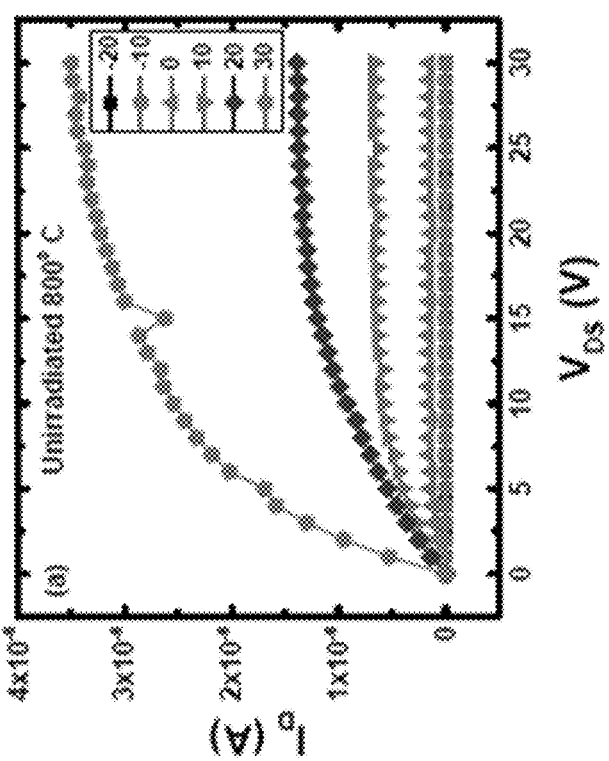
FIG. 15A is a graph depicting output characteristics of unirradiated ZnO film annealed at 800° C. in accordance with some embodiments of the present disclosure.
Figure 15D:
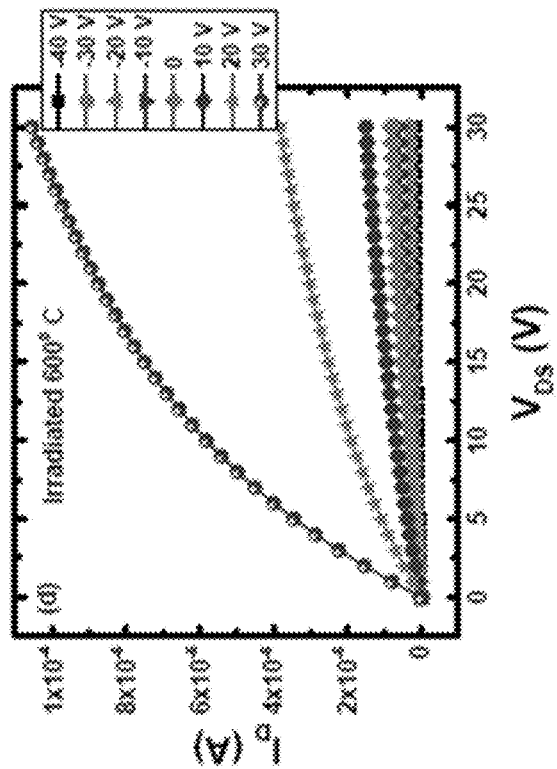
FIG. 15D is a graph depicting output characteristics of irradiated ZnO film annealed at 600° C. in accordance with some embodiments of the present disclosure.
Figure 15C:
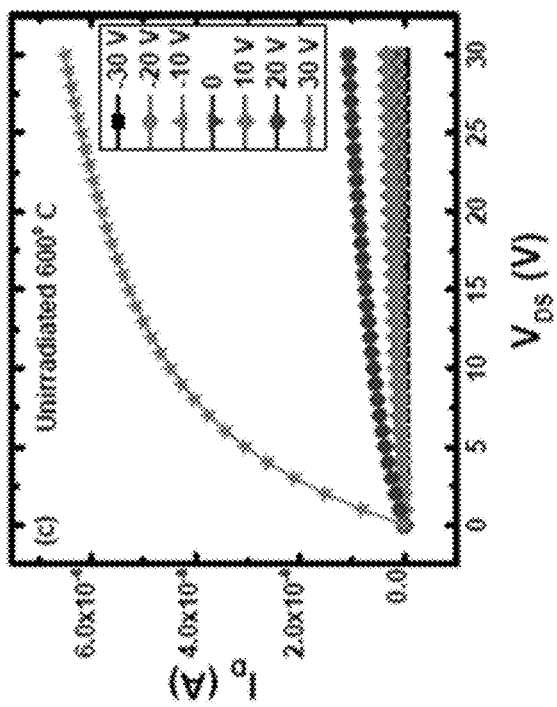
FIG. 15C is a graph depicting output characteristics of unirradiated ZnO film annealed at 600° C. in accordance with some embodiments of the present disclosure.
Figure 15F:
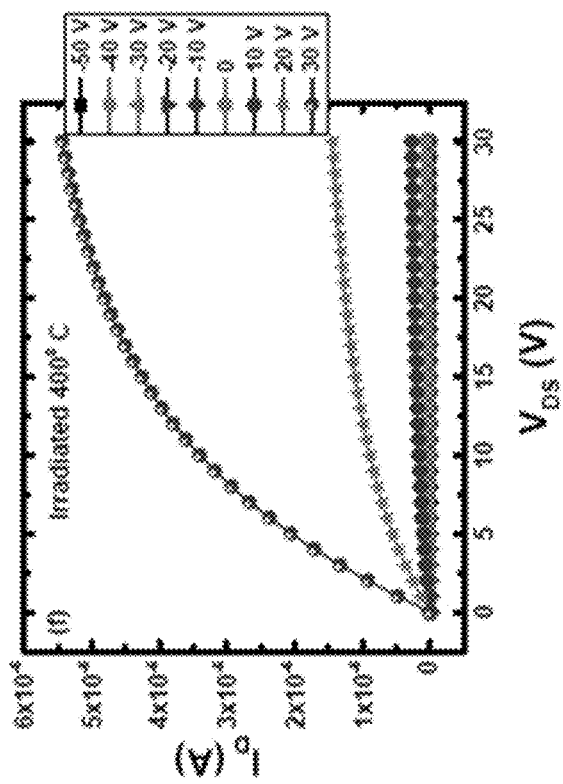
FIG. 15F is a graph depicting output characteristics of irradiated ZnO film annealed at 400° C. in accordance with some embodiments of the present disclosure.
Figure 15E:
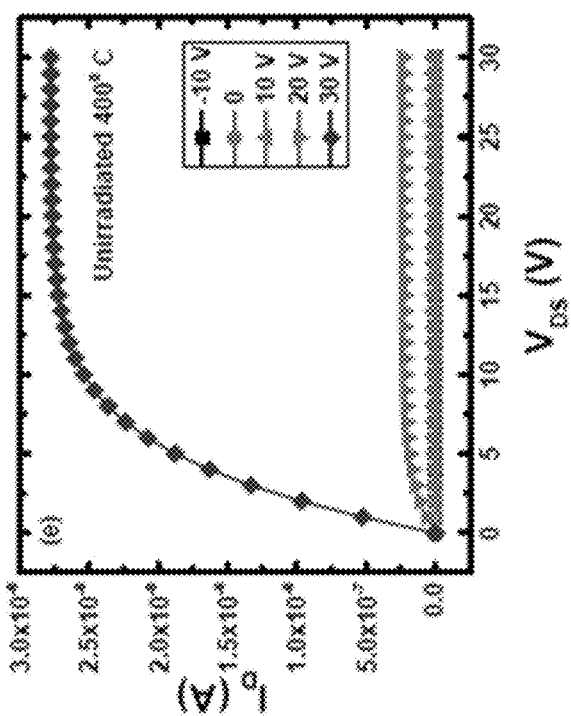
FIG. 15E is a graph depicting output characteristics of unirradiated ZnO film annealed at 400° C. in accordance with some embodiments of the present disclosure.
Figure 15G:
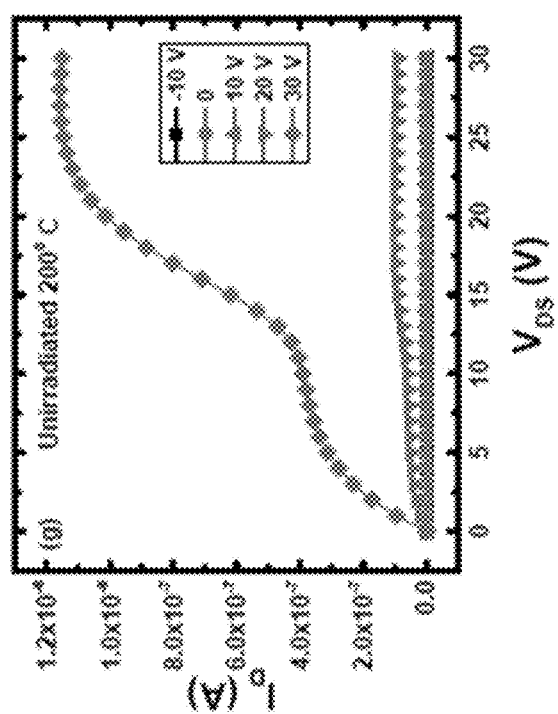
FIG. 15G is a graph depicting output characteristics of unirradiated ZnO film annealed at 200° C. in accordance with some embodiments of the present disclosure.

FIG. 14A is a graph showing a proton dose-depth profile for a TFT device having a passivation layer, and FIG. 14B is graph a showing proton a dose-depth profile for a TFT device having a passivation layer in accordance with some embodiments of the present disclosure. The figures show a simulated proton dose profile for two separate TFT 205 devices as shown in FIG. 13.

In the embodiment of the figures, a Monte Carlo code TRIM (Transport of Ions in Matter) was used to simulate the proton dose distribution in the passivation layer 207 (Pd/photoresist) and ZnO/SiO2/Si stack (e.g., layers 10, 15, 20 of TFT 205). As noted above, the passivation layer 207 may be employed to prevent a secondary radiation effect. A thinner layer 210 of a heavy element (e.g., heavy element layer 210) may passivate protons due to its higher stopping potential. It has been observed that many intense collisions in the heavy element passivation layer generate secondary radiation. In contrast, lighter materials (e.g., a polymer) may require an increased thickness, films to buffer protons with the same energy. As a result, photoresist layer 215 may have a thickness 224 that is less than that of the heavy element layer 210.

As noted above, the multilayer passivation layer 207 includes heavy element layer 210 and photoresist layer 215, which together may be configured to buffer energetic protons without generating secondary radiation. In the embodiment of the figures, data is provided for measurements of irradiation of two TFTs 205 with two different thicknesses for the passivation layer 207 (e.g., the sums of thicknesses 222 and 224 of respective TFT devices 205). The two thicknesses of the two passivation layer 207 in the embodiment of the figures were configured to locate an approximate maximum of dose 52 in two different locations: one in ZnO channel layer 10 and the other at ZnO/SiO$_2$ interface 13 (hereafter to be referred as type-Z and type-I, respectively). Both types of devices were fabricated as described above and then irradiated at room temperature via a dose 52 comprising a 200 keV proton beam of $1\times10^{14}$ protons/cm$^2$ fluence generated by a source 50 comprising a 2 MV Tandem source Pelletron accelerator.

The dose 52 in the illustrated embodiment comprises a constant beam current was maintained at 700 nA for a 781 s exposure time to obtain $1\times10^{14}$ proton/cm$^2$ fluence. As shown by the figures, the TRIM simulation may demonstrate peaks of proton doses at a surface 234 of the ZnO channel layer 10 and ZnO/SiO$_2$ interface 13 for type-Z and type-I devices, respectively.

FIGS. 15A-15G are graphs depicting output characteristics of irradiated and unirradiated ZnO films annealed at temperatures of approximately 200° C., 400° C., 600° C. and 800° C. in accordance with some embodiments of the present disclosure. The figures show exemplary output characteristics comparison for ZnO thin-films (e.g., first and second pluralities of exemplary devices each configured similar to a stack 3 and comprising a ZnO thin-film channel layer 10 as discussed with regard to FIGS. 5A-5D, 6A-6D, and 7A-7C above) before and after irradiation by gamma rays for each annealing temperature. In the embodiment of the figures, unirradiated devices were shown pinch-off characteristics of n-type semiconductor FETs with the linear region at lower $V_{DS}$ and saturation region at higher $V_{DS}$ for all other annealing temperatures except 200° C. As noted above, devices annealed at approximately 200° C. samples failed to show characteristics consistent with performance as a transistor after the irradiation. Notably, the electrical conductance appears to increase after the irradiation for annealing temperatures of approximately 400° C., 600° C.

and, 800° C. annealed samples. As shown in additional detail in FIGS. 7A-7C, a $V_{th}$ shift to a negative gate bias direction indicates the gate oxide traps. The positively charged oxide traps enhance the carrier concentration by improving the gate electric field. Therefore, an electrical conductance increment may be observed in the irradiated devices (e.g., the first plurality of ZnO film devices), and may be influenced primarily by the radiation induced oxide traps in a device's gate dielectric layer (e.g., dielectric layer 15).

The first plurality of devices annealed at a temperature of 600° C. and irradiated as described above may show approximately two orders of magnitude increment in $I_D$ compared to the corresponding unirradiated devices of the second plurality of devices while devices from the first plurality of devices annealed at temperatures of approximately 800° C. and 400° C. may show approximately one order of magnitude increments in $I_D$. In some embodiments, devices annealed at a temperature of approximately 600° C. may show a higher tendency to create irradiation induced oxide traps than devices annealed at other temperatures. The irradiated devices from the first plurality of devices annealed at a temperature of approximately 800° C. may show a least deviation in electrical conductance from characteristics of unirradiated devices from the second plurality of devices annealed at 800° C. compared with one or more deviations between irradiated and unirradiated devices annealed at other temperatures. Thus, in some embodiments, an annealing temperature of approximately 800° C. for ZnO films may enhance a radiation tolerance of a TFT (e.g., TFT 5) comprising a ZnO channel layer 10, with minimum device degradation after irradiation.

Note that, in some embodiments, an annealing temperature at which a radiation tolerance is enhanced may vary for a TFT (e.g., TFT 5) fabricated with a channel layer 10 comprising other materials besides ZnO, or in other states besides a crystalline or highly-crystalline state (e.g., amorphous, nanocrystalline, etc.). In some embodiments, a device (e.g., stack 3 or TFT 5) may comprise a channel layer 10 that comprises a material (e.g., other than crystalline ZnO) which may need to be annealed at a temperature other than between approximately 600° C. and 800° C. in order to achieve the radiation tolerance described herein. In some embodiments, such annealing temperature may be less than or equal to approximately 800° C., and may be greater than or equal to approximately 800° C. Thus, in some embodiments, the techniques described herein may be applied to approximate a range of annealing temperatures for which a desired radiation tolerance may be achieved for devices fabricated with a particular material in a particular state. In addition, it will be appreciated that the techniques herein may be applied to enhance a device's radiation tolerance by performing at other temperatures, depending on the material selected.

Figure 16B:
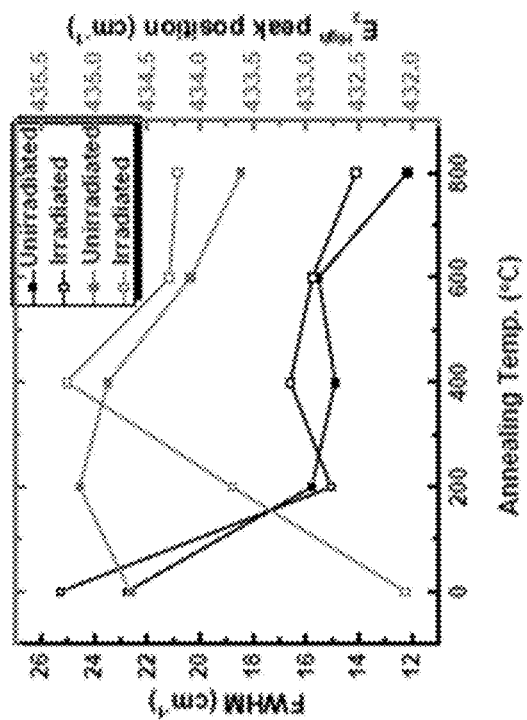
FIG. 16B is a graph depicting position and full-width half-maximum of Raman peak intensity mode for irradiated and unirradiated ZnO film annealed at various temperatures in accordance with some embodiments of the present disclosure.
Figure 16A:
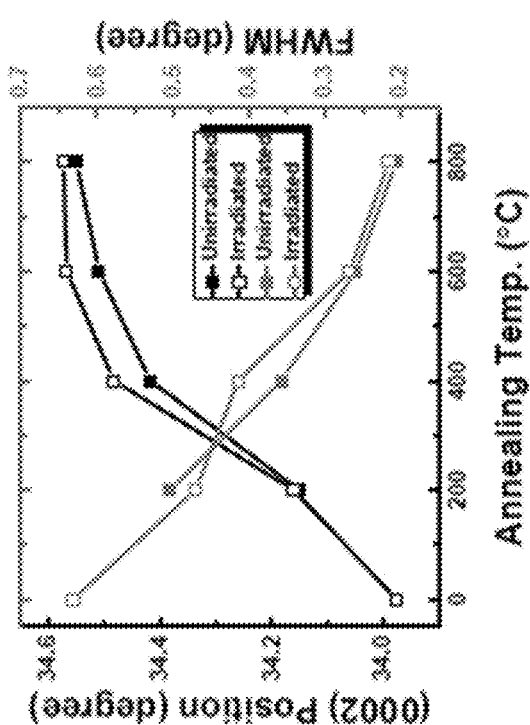
FIG. 16A is a graph depicting position and full-width half-maximum of X-Ray diffraction peak intensity for irradiated and unirradiated ZnO film annealed at various temperatures in accordance with some embodiments of the present disclosure.
Figure 17B:
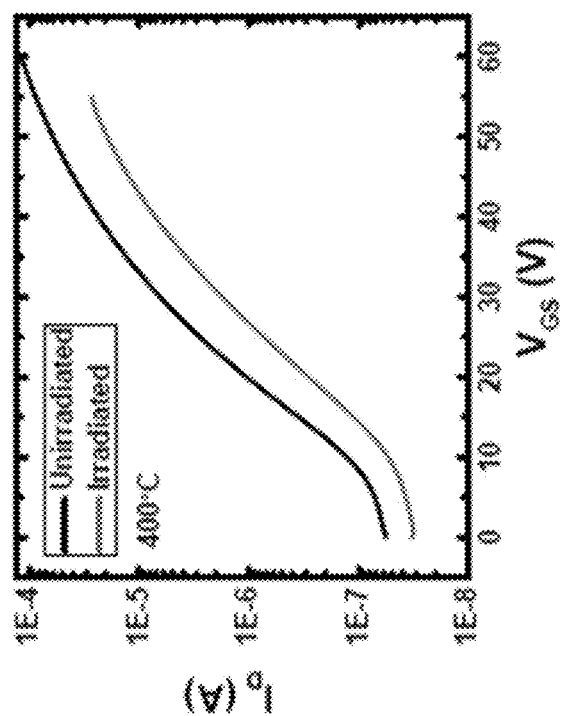
FIG. 17B is a graph depicting transfer characteristics of irradiated and unirradiated ZnO TFTs annealed at 400° C. in accordance with some embodiments of the present disclosure.
Figure 17A:
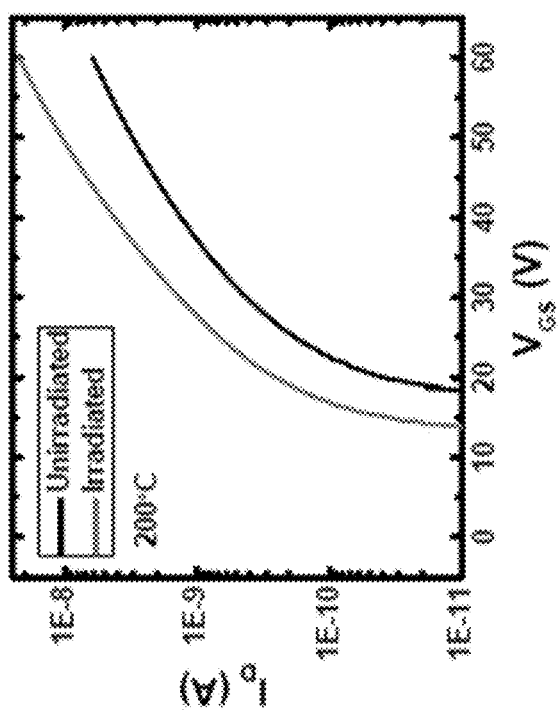
FIG. 17A is a graph depicting transfer characteristics of irradiated and unirradiated ZnO TFTs annealed at 200° C. in accordance with some embodiments of the present disclosure.
Figure 17D:
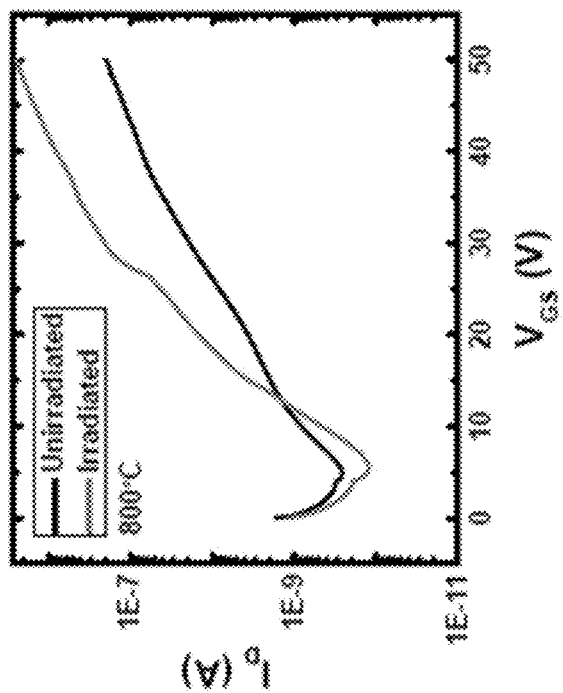
FIG. 17D is a graph depicting transfer characteristics of irradiated and unirradiated ZnO TFTs annealed at 800° C. in accordance with some embodiments of the present disclosure.
Figure 17C:
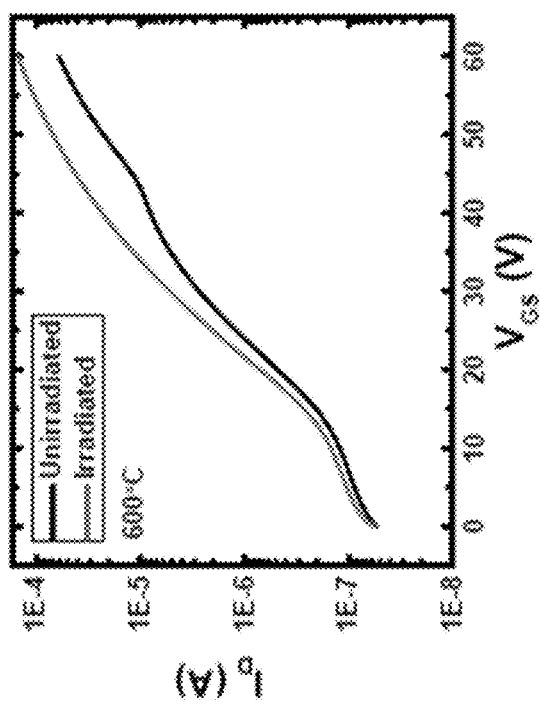
FIG. 17C is a graph depicting transfer characteristics of irradiated and unirradiated ZnO TFTs annealed at 600° C. in accordance with some embodiments of the present disclosure.

FIG. 16A is a graph depicting position and full-width half-maximum of X-Ray diffraction peak intensity for irradiated and unirradiated ZnO film annealed at various temperatures, and FIG. 16B is a graph depicting position and full-width half-maximum of Raman peak intensity mode for irradiated and unirradiated ZnO film annealed at various temperatures in accordance with some embodiments of the present disclosure. FIG. 16A shows data indicative of exemplary positions and FWHM values of X-ray diffraction pattern ("XRD") (0002) peak (e.g., as detected via one or more detectors, like detector 58), and FIG. 16B shows data indicative of position and FWHM of a Raman $E_2$ mode (e.g., as detected via one or more detectors, like detector 58). The information and data shown in the graphs of the figures further indicates that a radiation hardness of the devices described herein comprising ZnO depends at least in part on annealing temperature.

FIGS. 17A-17D are graphs depicting transfer characteristics of irradiated and unirradiated ZnO TFTs annealed at 200° C., 400° C., 600° C., and 800° C. in accordance with some embodiments of the present disclosure. The figures show a comparison of transfer characteristics for TFT devices (e.g., fabricated in a configuration similar to that of TFT 5) annealed at the various temperatures indicated in the figures both before and after irradiation by dose 52 from source 50. In the illustrated embodiment, the dose 52 is a proton dose. In an embodiment of the invention, an interface between ZnO channel layer 10 and a $SiO_2$ dielectric layer 15 may be prone to permanent displacement damage upon proton irradiation. In contrast, the ZnO channel layer 10 bulk may be less susceptible to such permanent displacement damage. In some embodiments, thickness of a passivation layer 207 may be manipulated (e.g., the thickness may be increased or decreased) such an approximate maximum distribution of the proton dose 52 is confined within the channel layer 10 or at the $ZnO/SiO_2$ interface 13. In the embodiment of the figures, a passivation layer thickness 207 was selected such that an approximate maximum proton dose 52 was concentrated at the interface 13 for each of the devices. Transfer characteristics may be collected before and after irradiation of each TFT 5 device by the dose 52 in order to further examine instability of each TFT 5 after bombardment by protons of the dose 52. Exemplary transfer characteristic extraction parameters may be a $V_{DS}$ of approximately 30V, and the dose 52 may be a fluence exposure of approximately 200 KeV $1\times10^{14}$ protons/cm$^2$.

Figure 18B:
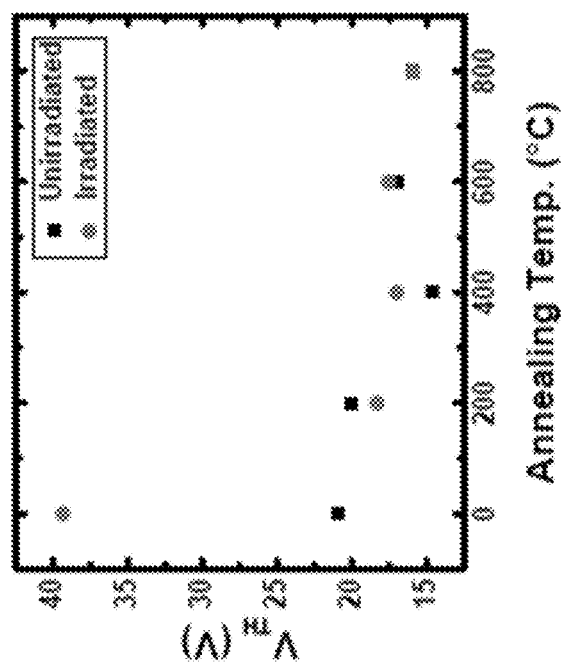
FIG. 18B is a graph depicting threshold voltage values of irradiated and unirradiated ZnO TFTs annealed at various temperatures in accordance with some embodiments of the present disclosure.
Figure 18A:
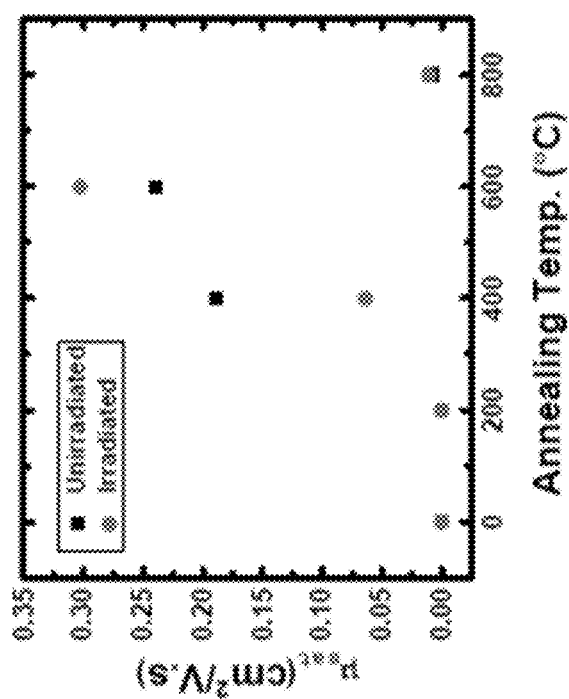
FIG. 18A is a graph depicting field effect mobility of irradiated and unirradiated ZnO TFTs annealed at various temperatures in accordance with some embodiments of the present disclosure.

FIG. 18A is a graph depicting field effect mobility of irradiated and unirradiated ZnO TFTs annealed at various temperatures, and FIG. 18B is a graph depicting threshold voltage values of irradiated and unirradiated ZnO TFTs annealed at various temperatures in accordance with some embodiments of the present disclosure. In some embodiments, a threshold voltage ($V_{TH}$) for a TFT 5 fabricated as described herein may tend to shift in either a positive gate bias direction or negative gate bias direction as a result of radiation-induced interface trap density or trapped charges in the dielectric layer 15. It is an aspect of the invention that $V_{TH}$ for a TFT 5 or similar device may be extracted using linear extrapolation of following equation:

$$\sqrt{I_D} = \sqrt{\frac{C_i W \mu}{2L}} (V_{GS} - V_{TH})$$

where $\mu$ is the mobility, $C_i$ is the capacitance of the dielectric layer 15 (and the dielectric layer comprises $SiO_2$). The $C_i$ for a TFT 5 or similar device may be calculated by:

$$C_i = k\varepsilon_0/d$$

where k is the relative dielectric constant of $SiO_2$ (3.9), $\varepsilon_0$ is the vacuum permittivity, and d is the thickness of the $SiO_2$ layer (100 nm). A calculated value of $C_i$ may be approximately $3.45\times10^{-8}$ F/cm$^2$, and (W/L) may represent the channel width-to-length ratio. FIG. 18A shows data indicative of mobility as a function of the annealing temperature. FIG. 18B shows the $V_{TH}$ shift of devices upon proton irradiation for devices fabricated with ZnO channel annealed at different temperatures.

Figure 19:
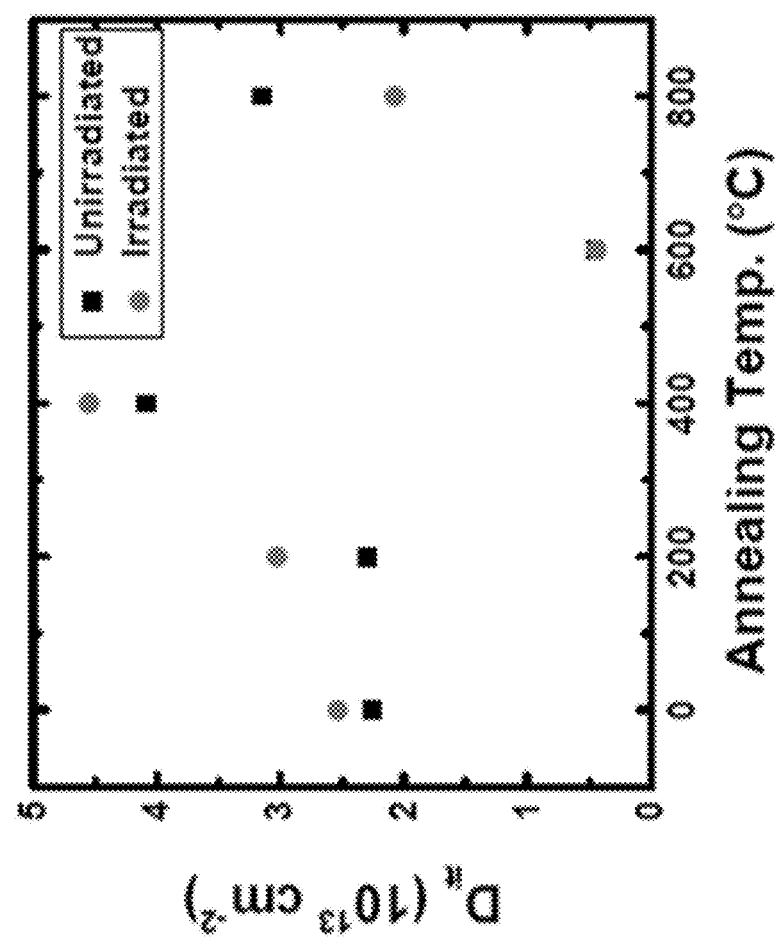
FIG. 19 is a graph depicting interface trap densities of irradiated and unirradiated ZnO TFTs annealed at various temperatures in accordance with some embodiments of the present disclosure.

FIG. 19 is a graph depicting interface trap densities of irradiated and unirradiated ZnO TFTs annealed at various temperatures in accordance with some embodiments of the present disclosure. As can be seen in the figure, the $V_{TH}$ shift has been minimized in devices fabricated with high-temperature annealed ZnO channel layers. It is therefore an aspect of some embodiments of the present disclosure that radiation-induced traps the dielectric layer 15 and at the ZnO/SiO2 interface 13 may be when the ZnO channel layer has a high annealing temperature (e.g., approximately 600° C. or higher).

In the illustrated embodiment, interface trap density ($D_{it}$) can be calculated with subthreshold swing (SS) extracted from transfer characteristics.

$$SS = \left(\frac{d\log I_D}{dV_{GS}}\right)^{-1}$$

In an aspect of some embodiments of the present disclosure, subthreshold swing (SS) shows a direct relationship with $D_{it}$ as follows:

$$D_{it} = \left(\frac{0.434 \cdot (SS)}{k_B T/q} - 1\right)\frac{C_i}{q}$$

where $k_B$ is the Boltzmann constant, T is absolute temperature (e.g., approximately 300 K). The figure illustrates exemplary $D_{it}$ values for devices before and after proton irradiation as a function of an annealing temperature of a ZnO channel layer of each of the respective devices.

In the illustrated embodiment, a ZnO TFT fabricated with channel layer 10 annealed at approximately 600° C. may show a negligible change in $D_{it}$ after proton irradiation compared to unirradiated devices with channel layers 10 annealed at the same or a similar temperature. Hence, an annealing temperature of approximately 600° C. of a ZnO channel layer 10 may promote high stability at the ZnO/SiO$_2$ interface 13 against proton irradiation.

As described above, it has been observed that an extent to which a TFT 5 is radiation tolerant may depend at least partly upon characteristics of the channel layer 10. For a channel layer 10 comprising crystalline ZnO, radiation tolerance increases as annealing temperature of the layer 10 increases. A channel layer 10 made from highly-crystalline ZnO thus may have a higher radiation tolerance than a channel layer made from ZnO with less crystallinity. In this regard, for crystalline substances, annealing a film (e.g., channel layer 10) at a temperature that yields a high degree of crystallinity may increase radiation tolerance of devices fabricated with the film (e.g., TFT 5). In some embodiments, an average grain diameter of the channel layer 10 may be approximately 75 nm or larger, but other diameters are possible in other embodiments, (e.g., approximately 50 nm or larger, approximately 100 nm or larger, etc.).

In addition, in embodiments in which a material other than crystalline ZnO is selected, a TFT (e.g., TFT 5) has been fabricated using a material that is in an amorphous, nanocrystalline, or microcrystalline state, radiation tolerance of the device may be better defined in terms of a defect density, non-ionizing energy loss or sub-threshold swing than "grain size." In addition, photoluminescence can be used to "qualitatively" measure the defect densities of a semiconducting material. Further, "interfacial" defect density can be deduced from sub-threshold swing values. In some embodiments, various types of defects indicative of a material's radiation tolerance can be studied by using different characterization techniques.

Figure 20:
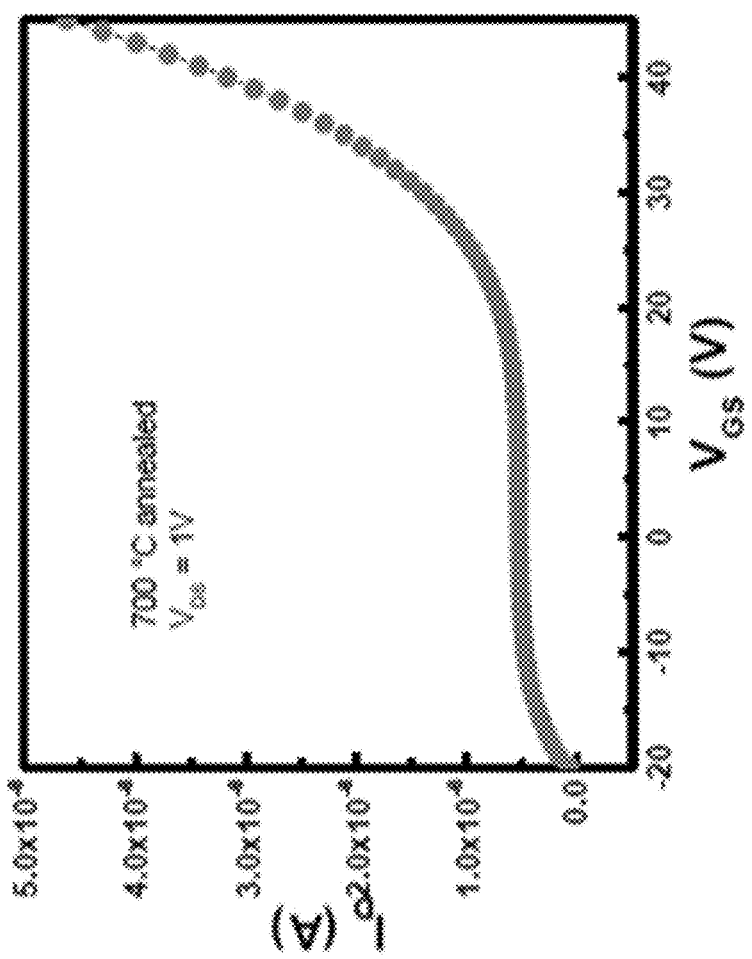
FIG. 20 is a graph depicting transfer characteristics of an irradiated ZnO TFT annealed at 700° C. in accordance with some embodiments of the present disclosure.
Figure 21:
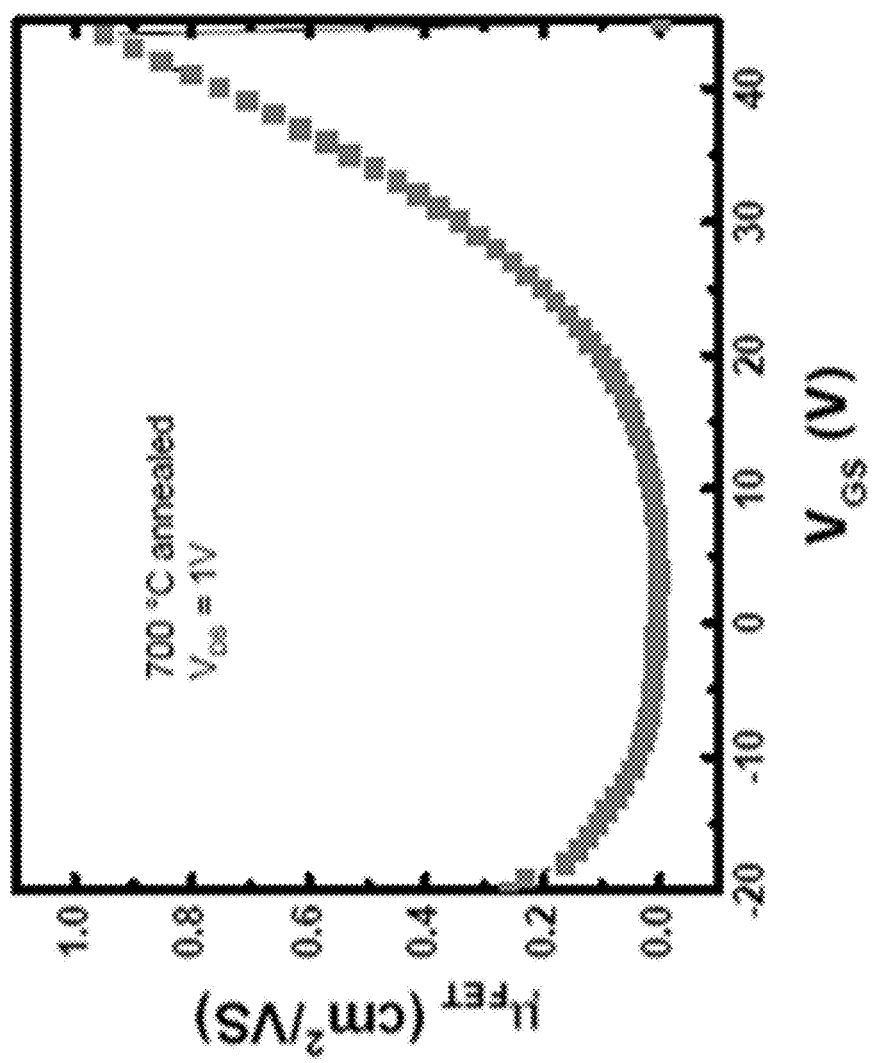
FIG. 21 is a graph depicting field effect mobility of an irradiated ZnO TFT annealed at 700° C. in accordance with some embodiments of the present disclosure.

FIG. 20 is a graph depicting transfer characteristics of an irradiated ZnO TFT annealed at 700° C., and FIG. 21 is a graph depicting field effect mobility of an irradiated ZnO TFT annealed at 700° C. in accordance with some embodiments of the present disclosure. The graph of FIG. 20 shows a transfer I-V curve of a TFT 5 that has been configured for testing according to an embodiment of the present disclosure. The graph of FIG. 21 shows an extracted field effect mobility of test TFT 5.

In the illustrated embodiment, at least one TFT 5 was fabricated as a bottom-gate ZnO circular TFT 5 using essentially the same techniques described above. One or more highly doped p-type Si wafers may be dry oxidized to form an oxide layer (dielectric layer 15 comprising a gate insulator SiO$_2$) with a thickness of approximately 100 nm. The at least one TFT 5 comprises a ZnO thin film channel layer 10 with a thickness 22 of approximately 70 nm may be deposited via RF magnetron sputtering, and the sample may be annealed at approximately 700° C. for approximately one hour. A bottom side of the sample was etched through BOE to expose the Si wafer 20. Source 36, drain 38, and gate (not explicitly shown) metallic contacts made of Al may be deposited using evaporation. The TFT 5 may be coupled to a chip carrier (not explicitly shown) for testing, such as a C-DIP 48 pin KD-82293-C or other suitable device. Wedge wire bonding may be used to connect pads on the chip carrier and the contacts of the TFT 5, which may be connected using various suitable techniques.

Figure 22:
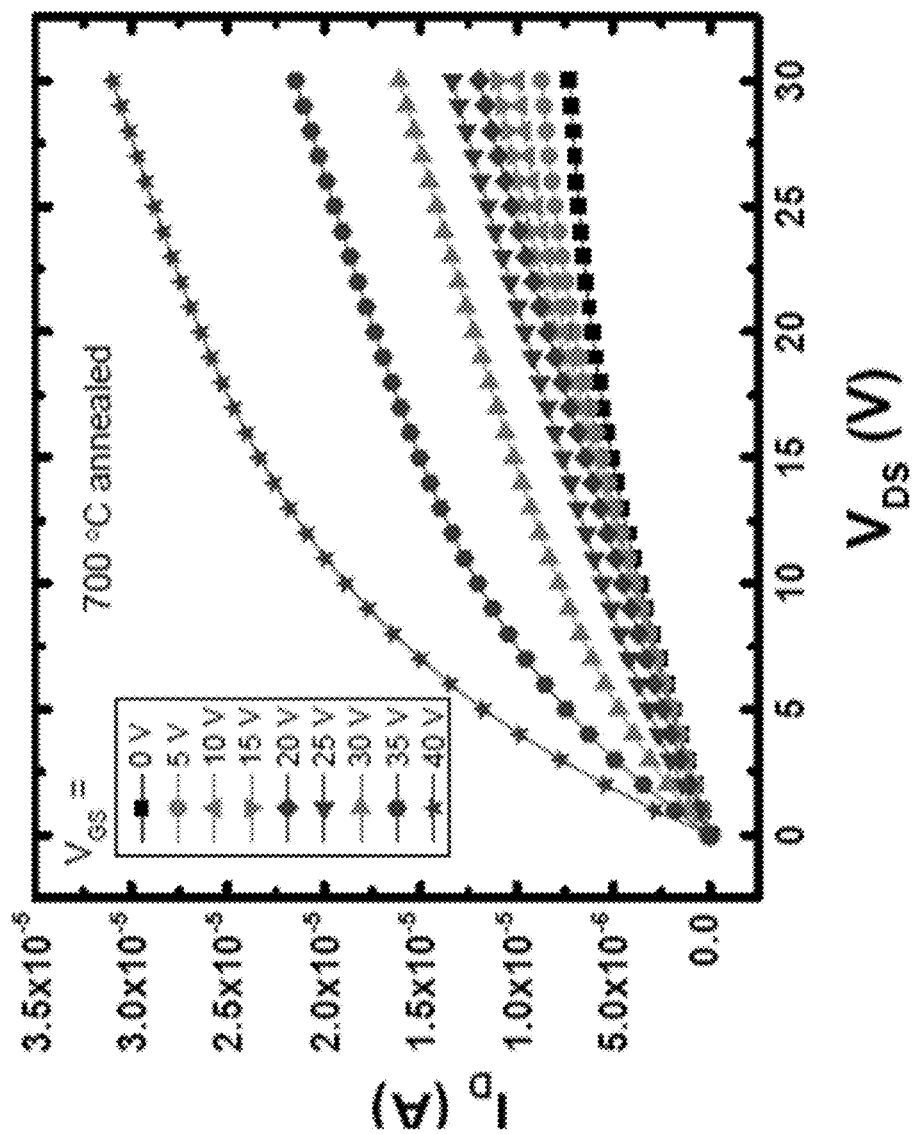
FIG. 22 is a graph depicting output characteristics of an irradiated ZnO TFT annealed at 700° C. in accordance with some embodiments of the present disclosure.

In some embodiments, after the TFT 5 is coupled to the chip carrier (not explicitly shown in the figures), a semiconductor characterization system parameter analyzer may be used to characterize the TFT on a breadboard (not explicitly shown). The semiconductor characterization system may comprise one or more devices such as a Keithley 6517 SourceMeter® voltage source instrument device or other similar device. A representative measured TFT may be located at various locations on the chip carrier device, although the TFT measured in the illustrated embodiment is located in the center of the chip carrier. In the illustrated embodiment, the transfer curve was measured by changing a gate voltage of the TFT from −20 V to 45 V. In addition, $V_{DS}$ was selected as 1 V because at such voltage, it has been observed that a TFT may be able to a relatively high transfer current and still perform with a in an essentially linear region (FIG. 4). The output I-V curve directly reflects a transistor working condition and was measured and plotted in FIG. 22 is a graph depicting output characteristics of an irradiated ZnO TFT annealed at 700° C. in accordance with some embodiments of the present disclosure.

The foregoing description illustrates and describes the processes, machines, manufactures, compositions of matter, and other teachings of the present disclosure. Additionally, the disclosure shows and describes only certain embodiments of the processes, machines, manufactures, compositions of matter, and other teachings disclosed, but, as mentioned above, it is to be understood that the teachings of the present disclosure are capable of use in various other combinations, modifications, and environments and is capable of changes or modifications within the scope of the teachings as expressed herein, commensurate with the skill and/or knowledge of a person having ordinary skill in the relevant art. The embodiments described hereinabove are further intended to explain certain best modes known of practicing the processes, machines, manufactures, compositions of matter, and other teachings of the present disclosure and to enable others skilled in the art to utilize the teachings of the present disclosure in such, or other, embodiments and with the various modifications required by the particular applications or uses. Accordingly, the processes, machines, manufactures, compositions of matter, and other teachings of the present disclosure are not intended to limit the exact embodiments and examples disclosed herein. Any section headings herein are provided only for consistency with the suggestions of 37 C.F.R. § 1.77 or otherwise to provide organizational queues. These headings shall not limit or characterize the invention(s) set forth herein.

What is claimed is:

1. A method, comprising:
   providing a layer comprising zinc oxide or zinc tin oxide;
   determining an annealing temperature, wherein the determining is based on a dose of radiation expected to irradiate a thin-film transistor comprising the layer; and
   annealing, based on the determining, the layer, wherein the layer has a thickness and threshold displacement energies after the annealing such that when the dose irradiates the layer, a change in performance of the thin-film transistor when a voltage is applied is less than a performance threshold.

2. The method of claim 1, wherein determining an annealing temperature comprises determining an annealing temperature of the layer for which:
   a) a difference between a transfer characteristic value of the thin-film transistor before the dose and the transfer characteristic value after the dose is less than a first threshold; and
   b) a difference between a transistor output characteristic value of the thin-film before the dose and the transistor output characteristic value after the dose is less than a second threshold; and wherein the first threshold and second threshold are based on a desired performance of the thin-film transistor when a voltage is applied.

3. The method of claim 1, wherein the zinc oxide or zinc tin oxide comprises crystalline zinc oxide or crystalline zinc tin oxide.

4. The method of claim 1, wherein the zinc oxide or zinc tin oxide comprises amorphous zinc oxide or amorphous zinc tin oxide.

5. The method of claim 1, wherein the thin-film transistor is coupled to a circuit of an electronic device.

6. The method of claim 5, wherein the electronic device is a mobile device, a flat panel display, or an avionics system.

7. The method of claim 1, wherein the thickness of the annealed layer is at least 70 nm.

8. The system of claim 1, wherein the layer comprises crystalline zinc oxide, and wherein the annealing is performed at a temperature of at least than 600° C.

* * * * *